United States Patent [19]

Douglas et al.

[11] 4,393,455
[45] Jul. 12, 1983

[54] MODULAR ELECTRONIC MEASURING AND PRINTING UNIT

[75] Inventors: Alec T. Douglas; James S. Havers, both of St. Johnsbury, Vt.

[73] Assignee: Colt Industries Operating Corp., New York, N.Y.

[21] Appl. No.: 174,279

[22] Filed: Jul. 31, 1980

[51] Int. Cl.³ .................. B41J 3/12; G06K 15/10
[52] U.S. Cl. .................. 364/519; 101/93.04; 101/93.05; 364/900; 400/121; 400/708
[58] Field of Search .......... 364/466, 708, 519, 900; 101/93.04, 93.05; 400/121, 124, 708

[56] References Cited

U.S. PATENT DOCUMENTS

| | | | |
|---|---|---|---|
| 3,623,119 | 11/1971 | Orr | 346/9 |
| 3,665,169 | 5/1972 | Henderson et al. | 177/25 |
| 3,701,991 | 10/1972 | Livesey | 346/9 |
| 3,845,850 | 11/1974 | Herr et al. | 400/120 |
| 3,893,558 | 7/1975 | Fulton et al. | 101/93.05 X |
| 3,909,626 | 9/1975 | Balasubramanian et al. | 364/900 X |
| 3,923,135 | 12/1975 | Holman et al. | 400/121 |
| 3,962,570 | 6/1976 | Loshbough | 364/466 |
| 4,019,619 | 4/1977 | Emenaker | 400/708 |
| 4,084,250 | 4/1978 | Albertine et al. | 364/708 |
| 4,096,578 | 6/1978 | Malkemes | 364/900 |
| 4,116,567 | 9/1978 | San Pietro | 101/93.05 X |
| 4,159,882 | 7/1979 | Sanders, Jr. et al. | 364/900 X |
| 4,180,206 | 12/1979 | Takahashi et al. | 235/378 X |
| 4,187,552 | 2/1980 | Verstegen | 364/900 |
| 4,204,777 | 5/1980 | Jen | 101/93.05 X |
| 4,229,794 | 10/1980 | Foster | 364/466 |
| 4,236,835 | 12/1980 | Mayne et al. | 101/93.04 X |
| 4,242,003 | 12/1980 | Ragen | 101/93.05 X |
| 4,248,147 | 2/1981 | Zenner | 101/93.05 |
| 4,260,268 | 4/1981 | Arai | 101/93.04 X |
| 4,262,591 | 4/1981 | Cook | 400/124 X |
| 4,264,396 | 4/1981 | Stewart | 101/93.05 X |
| 4,278,359 | 7/1981 | Weikel | 400/121 X |
| 4,280,179 | 7/1981 | Jones, Jr. et al. | 364/900 X |
| 4,284,362 | 8/1981 | Jackson et al. | 364/900 X |

OTHER PUBLICATIONS

Klein: Programmed Printer Controller SMP-E 355 and E356 Siemens Components, vol. XV, No. 3, (1980), pp. 139-143.
Ignoffo et al.: Managing Dot-Matrix Printing With a Microprocessor, Hewlett-Packard Journal, vol. 29, No. 15, Nov. 1978, pp. 8-19.

*Primary Examiner*—Felix D. Gruber
*Attorney, Agent, or Firm*—Sixbey, Friedman & Leedom

[57] ABSTRACT

A compact, modular, electronic measuring unit (10) constructed for enclosure within a small, portable housing (12) having a removable front wall (40) to provide access to the enclosure (28) formed within the housing (12). A measuring and indicator circuit card (60) is mounted within the enclosure (28) adjacent the front wall (40) while a power circuit card (58) is mounted within the enclosure adjacent the rear wall (22) thereof. Manual control units (44, 52, 54) are mounted on the front wall (40) of the housing (12) and are removable therewith.

A moving dot matrix printer (56) is mounted within the housing (12) and is connected to receive data from the measuring and indicator circuit (60). This printer (56) is activated by one of the control units (50) on the front wall (40) of the housing (12), and includes a printer unit (116) which is driven in a first plane during the printing of a character on a record medium (178) and a record medium drive unit (136, 148, 150) which drives a record medium (178) in a second plane transverse to the first plane during the printing of a character.

28 Claims, 12 Drawing Figures

FIG. 5.
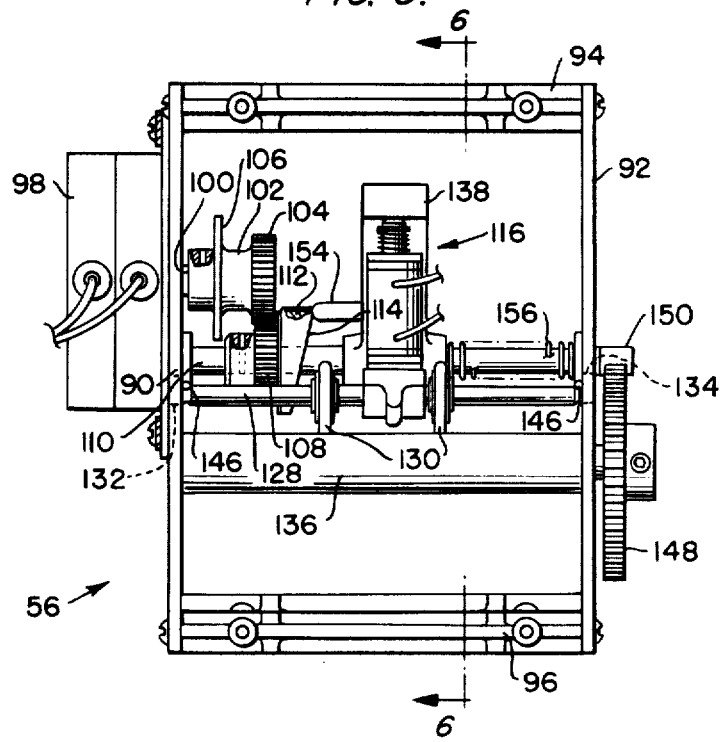
FIG. 6.
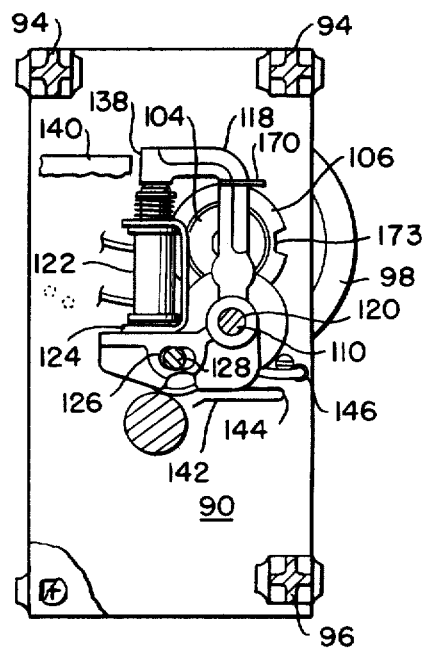
FIG. 7.

MODULAR ELECTRONIC MEASURING AND PRINTING UNIT

TECHNICAL FIELD

The present invention relates generally to electronic measuring units capable of providing a digital indication representative of a value to be measured while simultaneously providing a printed representation of such digital indication upon a record form.

BACKGROUND ART

Recent advances in electronic technology which have made available low cost but efficient microprocessor systems have led to the development of improved electronic measuring systems capable of providing a digital indication representative of a value to be measured. These microprocessor controlled systems, such as that disclosed by U.S. Pat. No. 3,962,570 to Loshbough, provide automatic zeroing, zero set functions, tare control, and many other functions previously provided by much more complex logic circuits, such as that disclosed by U.S. Pat. No. 3,665,169 to Henderson et al. Additionally, microprocessor measuring systems may be programmed to provide a number of calibration functions and other program control functions which previously have been performed by excessively expensive, large and complex electronic units.

Although microprocessor technology has resulted in the development of electronic measuring systems having greatly enhanced capabilities, such systems are generally still of substantial size, expensive, and difficult to service. This is particularly true when the measuring system is combined with both a visual digital indicator and a printer assembly for providing a record printout of the visual display. Combined electronic measuring and printer systems, such as those used for electronic weighing, are generally both large and complex, as illustrated by U.S. Pat. Nos. 3,623,119, to Orr and 3,701,991 to Livesey. Consequently, there is a demand for a small, compact, modular electronic measuring unit and printer system which may be operated from either a battery or a conventional power supply and which, although adapted to a wide variety of uses, may be easily and inexpensively serviced and repaired.

DISCLOSURE OF THE INVENTION

It is the primary object of the present invention to provide a low cost, compact, modular electronic measuring and printing unit which is of simple construction and which may be easily serviced in the field. This unit is constructed for enclosure within a small, portable housing having at least one removable wall to provide access to the enclosure within the housing. The electronic system for the unit is modular with a power supply system being mounted upon a circuit card adjacent the rear of the housing and the electronic circuitry for the measuring unit being mounted with an indicator system therefor on a circuit card adjacent the front wall of the housing. The front wall of the housing includes a window to facilitate visual observation of the indicator.

The present invention further provides a modular, portable electronic measuring unit mounted within a housing having a removable front wall section to provide access to the enclosure within the housing. The measuring system includes a power supply circuit provided upon a removable circuit card adjacent the rear of the housing and a measuring and indicator circuit provided upon a removable circuit card adjacent the front wall of the housing. The front wall of the housing carries mechanical control members removable with the front wall which cooperate with the measuring circuit card to control the operation of the measuring circuit when the front wall section is in place on the housing. This unit is designed to provide convenient access to the measuring circuit card so that simple calibration adjustment is facilitated.

Another aspect of the present invention is to provide a novel and improved modular, portable electronic measuring unit and printer system which is conveniently mounted within a small portable compact housing. The power supply circuit for the both the printer and the measuring system is mounted upon a single circuit card adjacent the rear wall of the housing, while the measuring circuit and control circuit for the printer system is mounted upon a single circuit card adjacent the front wall of the housing. This front circuit card also bears an indicator unit for the measuring system which provides a visual indication through a window in the front wall of the housing. Control actuators for both the measuring system and the printer are provided by elements mounted on the housing front wall and removable from the housing with the front wall.

It is another object of the present invention to provide a moving dot matrix printer for use with an electronic measuring system which operates to print alpha or numeric characters on a single or multiple copy pre-printed ticket form. The ticket form is inserted under a dot marker until a stop is engaged, wherein the ticket form will then be automatically fed out of the printer as printing occurs. The printer timing and character generation are controlled by a microprocessor with the characters being formed by a matrix of dots to a pattern stored in a non-volatile memory.

A further aspect of the present invention is to provide a moving dot matrix printer for use with an electronic measuring system having a print unit which is mounted for movement in a first plane and a print drive assembly to selectively move the print unit between spaced points in the first plane. The print unit marks an adjacent record medium and a record medium drive unit is provided to move the record medium in a second plane transverse to the first plane.

Another aspect of the present invention is to provide a moving dot matrix printer for use with an electronic measuring system wherein the printer forms alpha or numeric characters on a record medium by inscribing dots on the record medium at selected positions along spaced rows of a dot matrix. During printing, a printer unit is moved in a first plane and the record medium is moved in a second plane transverse to said first plane to form said spaced rows.

A further object of the present invention is to provide a modular, electronic measuring and printing unit wherein a single microprocessor chip is employed to control analog to digital conversion, arithmetic and display functions as well as the operation of a printer unit.

A still further object of the invention is to provide a modular electronic measuring and printing unit wherein a printer is employed as the chasis for the electronic circuit boards for the system. Novel circuit board structures are provided with sensing units and other components positioned to cooperate with printer components, and these circuit board structures are uniquely combined with the printer to form an operative module.

Additional objects, advantages and features of the invention will be more readily apparent from the following detailed description of a preferred embodiment of the invention when taken together with the accompanying drawings.

BRIEF DESCRIPTION OF THE DRAWINGS

FIG. 5 is a view in front elevation of the moving dot matrix printer employed with the modular electronic measuring and printing unit of FIG. 1;

FIG. 6 is a sectional view of the moving dot matrix printer of FIG. 5 taken along lines 6—6 of FIG. 5;

FIG. 7 is a partial view in side elevation of the record medium drive unit for the moving dot matrix printer of FIG. 5;

BEST MODE FOR CARRYING OUT THE INVENTION

Figure 1:
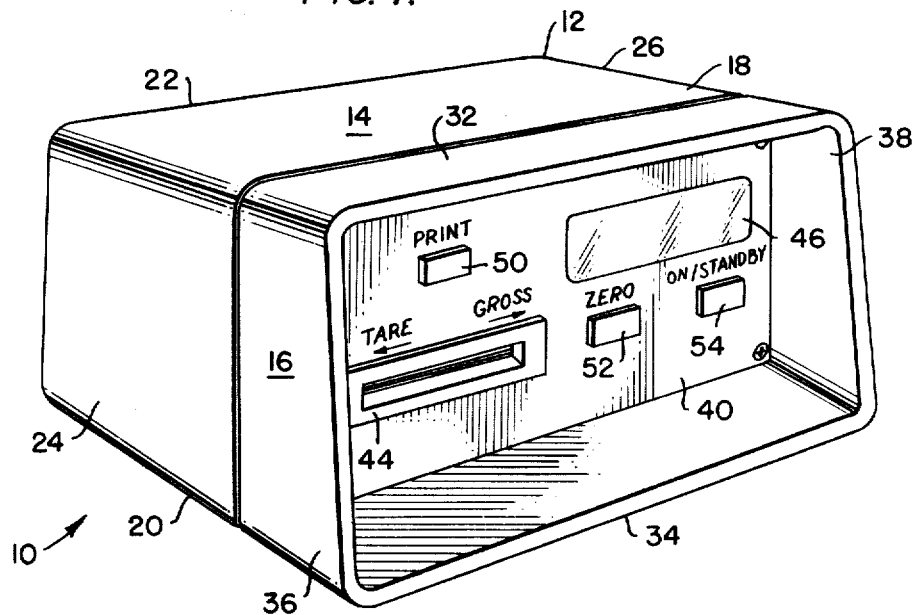
FIG. 1 is a perspective view of the modular electronic measuring and printing unit of the present invention.
Figure 2:
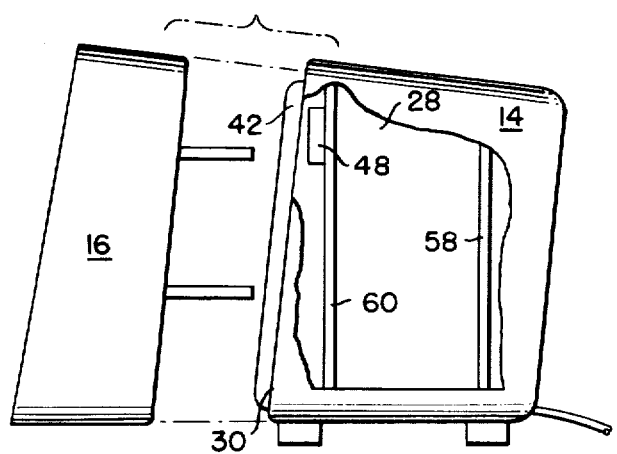
FIG. 2 is a partially cut away side view of the modular electronic measuring and printing unit of FIG. 1 with the first and second sections of the housing assembly separated.
Figure 3:
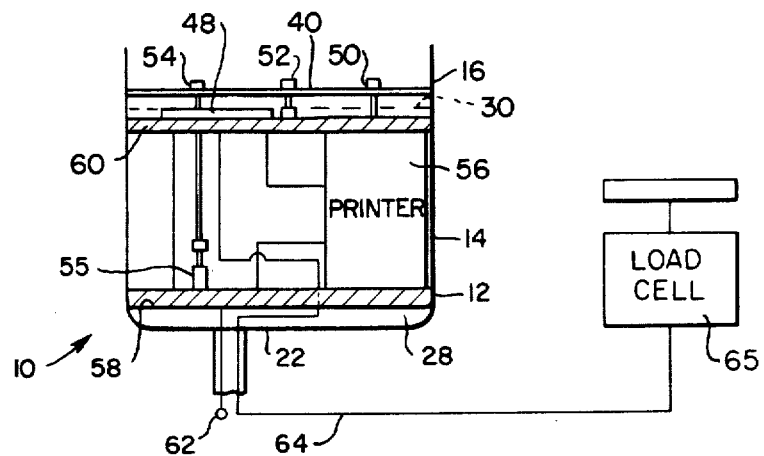
FIG. 3 is a diagrammatic plan view of the interior of the electronic measuring and printing unit of FIG. 1.

Referring now to FIGS. 1-3, the modular, portable, electronic measuring system and printing unit of the present invention indicated generally at 10 includes a housing 12 which is formed from a first housing assembly 14 and a second housing assembly 16. The housing assembly 14 includes a top wall 18, a bottom wall 20, a rear wall 22, and side walls 24 and 26, preferably formed as a unitary unit which defines an enclosure 28 having an open front side 30.

The second housing assembly 16 is adapted to be removably secured to the first housing assembly and operates to close the open front side 30 of the enclosure 28. This second housing assembly is formed by a top wall 32, a bottom wall 34, and side walls 36 and 38, all of which are connected together and substantially coextensive with the top, bottom and side walls of the first housing assembly 14 when the two housing assemblies are connected together. The top, bottom, and side walls of the second housing assembly provide a frame for a recessed face plate 40 which closes the open front side of the enclosure 28 when the second housing assembly 16 is secured to the first housing assembly 14. This may be accomplished by means of an indented, projecting flange 42 which extends from the front edge of the top, bottom, and side walls of the first housing assembly 14 and which is adapted to slide within the open rear side of the second housing assembly 16 to engage the inner surface of the walls thereof.

The face plate 40 includes an elongated slot 44 which receives a ticket or other record medium and a window 46 which is positioned to permit visual observation of a digital display indicator 48 mounted within the enclosure 28. Also mounted upon the face plate 40 are a print button 50, a zero button 52 and a power on/standby button 54 which cooperates with a power switch 55. These buttons may be depressed relative to the face plate 40, but are permanently mounted upon the face plate and are removable from the first housing assembly 14 with the second housing assembly 16.

FIG. 3 provides a diagrammatic illustration of the arrangement of components within the enclosure 28. This arrangement is quite significant, for it not only contributes to the compactness of the unit 10, but also facilitates simple and economic maintenance. It will be noted from FIG. 3, that a printer unit 56 is mounted within the enclosure so as to be in alignment with the slot 44 and operable by the print button 50. Also occupying the enclosure with the printer unit are a power supply circuit board 58 and a measuring and indicator circuit board 60. These two circuit boards are mounted on the printer unit 56 to form a subassembly that is completely functional when removed from the enclosure 28 and which may be conveniently replaced as a single unit. It is important to note that the power supply circuit board is positioned adjacent the rear wall 22 of the enclosure while the measuring and indicator circuit board 66 is positioned adjacent the open front side 30 of the enclosure and thus adjacent to the faceplate 40. Since the measuring and indicator circuit board carries the measuring circuit, the microprocessor unit, calibration adjustments, and the indicator unit for the system, the position of this board makes calibration simpler. Consequently, when the second housing assembly 16 is removed from the first housing assembly 14, the calibration controls and indicator are then readily accessible for convenient calibration.

With the power supply circuit board 58 arranged adjacent to the rear wall 22, convenient access for the input power line to the housing 12 is provided. This input power line will carry a power supply conductor 62 directly to the power supply circuit board 58; the short path thereby minimizing possible interference caused by the power supply conductor. A measuring signal conductor 64, which provides an electrical signal from a suitable measuring transducer to the measuring and indicator circuit board 60 may be routed through a separate entry for isolation from the power supply conductor. The conductor 64 might provide an electrical measurement signal from a load cell unit 65 when the modular portable electronic measuring and printer unit 10 is employed for weighing applications. The rearward positioning of the power supply circuit board 58 within the enclosure 28 provides convenient access to this board for the input power line 62 while also enabling this board to conveniently supply power to the printer 56 and the measuring and indicator circuit board 60. Also, since the power supply circuit board requires no adjustment, it need not be as accessible as the measuring and indicator circuit board 60.

Figure 4:
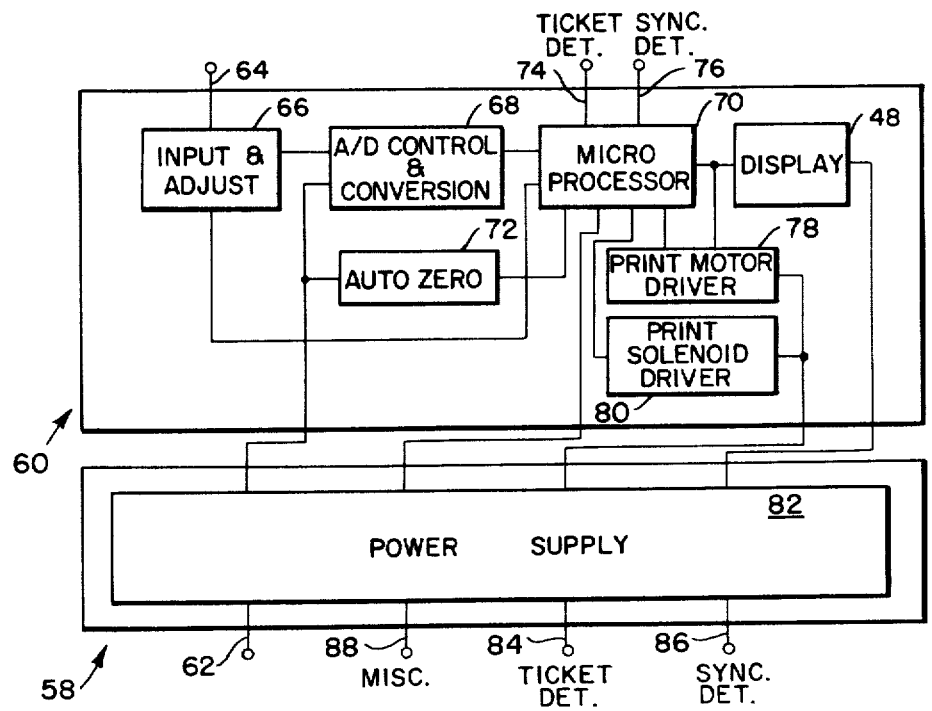
FIG. 4 is a block diagram of the power supply circuit and circuit for the electronic measuring and indicator system for the modular electronic measuring and printing unit of FIG. 1.

With reference to FIG. 4, it will be noted that the measuring and indicator circuit board 60 receives the input measurement signal on the line 64 at an analog input and adjust circuit 66. This circuit may constitute any input circuit for providing low drift application while permitting some analog adjustments to the incoming measurement signal. For example, in an electronic weighing system, this adjustment circuit might include the conventional operational amplifiers, comparators, span adjust circuitry, over capacity adjust circuitry, and dead load adjust circuitry. From the adjust circuit 66, the adjusted measurement signal is fed to an analog to digital control and conversion circuit 68 where the input analog measurement signal is converted into a digital signal for processing in a microprocessor 70. The analog to digital control and conversion circuit contains the circuitry necessary to accomplish a digital conversion and is locked into the microprocessor clock to ensure synchronization.

An auto zero adjust circuit 72, which may be activated by the control button 52, is connected to the microprocessor 70 which provides conventional automatic zero tracking and push button zeroing of the system. The microprocessor then controls the digital display provided by the visual display unit 48.

To this point, the components of the electronic measuring and display system contained on the circuit board 60 perform a measurement and display function in a conventional manner which is well known to the prior art. However, the microprocessor 70 is also programmed to control the operation of the printer 56, and to accomplish this function, the microprocessor receives an input from a ticket insertion detector on an input line 74 and a second input from a synchronization detector on an input line 76. The microprocessor provides control signals to a print motor driver 78 and also to a print solenoid driver 80.

The power supply circuit board includes a power supply circuit 82 to provide power to both the components on the measuring and indicator circuit board 60 as well as to components for the printer 56. For example, the power supply circuit provides power on a ticket detector output line 84 and also on a synchronizaton detector output line 86. Additionally, power is supplied to other miscellaneous components of the system on a miscellaneous line 88. For example, the line 88 could provide power to an optional heater for the modular electronic measuring and printing unit 10.

The structure of the moving dot matrix ticket printer 56 may best be understood with reference to FIGS. 5–7 and 12. The frame for the printer is formed by two vertically extending side plates 90 and 92 which are spaced apart by upper spacing bars 94 and lower spacing bars 96 secured to the side plates. Mounted on the exterior of the side plate 90 is a stepper motor 98 having an output shaft 100 which extends through the side plate and is mounted for rotation relative thereto. Secured to the stepper motor output shaft is a drive gear assembly 102 which includes a drive gear 104 and a position sensing flange 106. This drive gear 104 meshes in driving relation with a driven gear 108 which is secured to a main drive shaft 110. This main drive shaft extends between the side plates 90 and 92, and the two respective ends of the main drive shaft are mounted for rotation on the side plates. Thus the main drive shaft is rotated by the driven gear 108 and the drive gear 104 under the control of the stepper motor 98, and this results in the rotation of a cam disc 112. The cam disc is secured to the driven gear 108 for rotation therewith and includes an inclined cam face 114.

A solenoid operated printer assembly 116 is mounted for reciprocal movement along the main drive shaft 110. This printer assembly includes a carriage 118 having a shaft receiving opening 120 extending transversly through the bottom section thereof to receive the shaft 110. The shaft receiving opening is of sufficient size to permit the carriage 118 to slide freely back and forth along the shaft 110.

The carriage 118 is U-shaped in configuration and supports a print solenoid 122 between the legs of the U. This print solenoid is mounted upon the carriage by means of a bracket 124 secured to the carriage, and the bracket is provided with suitable apertures to permit a printing pin or other printing member operated by the print solenoid to extend downwardly and engage a record sheet passing beneath the solenoid operated printer assembly.

Figure 12:
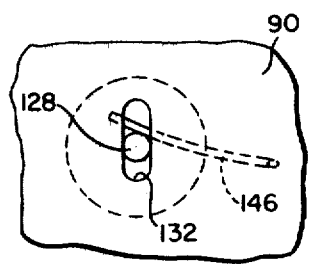
FIG. 12 is a partial view in side elevation of the pinch roller shaft mounting of FIG. 5.

The lower leg of the U-shaped carriage 118 is provided with a transverse aperture 126 to receive a shaft 128 for spaced pinch rollers 130. This shaft is mounted for upward movement in vertically inclined slots 132 and 134 in the side plates 90 and 92 (FIG. 12). Thus, when the print carriage 118 is pivoted about the main drive shaft 110, the shaft 128 and the pinch rollers 130 carried thereby are also pivoted about the main drive shaft due to the extension of the shaft 128 through the aperture 126 and the upward movement of the ends of the shaft in the slots 132 and 134.

The pinch rollers 130 normally contact a print drive roller 136 which extends between the side plates 90 and 92 and which is mounted for rotation relative thereto. A record medium to be printed by the solenoid operated printer is inserted between the print roller 136 and the pinch rollers 130. To accomplish this record medium insertion, the front surface of the upper leg for the U-shaped carriage 118 is formed to provide a flat area 138 which is contacted by a mechanical extension rod indicated at 40 on the print button 50 when the print button is depressed. This causes the carriage 118 to pivot about the main drive shaft 110, thereby pivoting the shaft 128 and raising the pinch rollers 130 above and away from contact with the print drive roller 136. This will permit a record medium to be inserted between the print drive roller and the pinch rollers and into a suitable guide 142 extending between the side plates 90 and 92.

When the record medium contacts a stop formed by the end 144 of the guide unit 142 or, when no guide unit is provided, the face of the power supply circuit board 58, the print button 50 may be released to initiate operation of the printer 56. Release of the button permits the carriage 118 to pivot back about the main drive shaft 110 until the pinch rollers 130 are again in contact with the print drive roller 136. To insure that this return movement occurs and to bias the pinch rollers into engagement with the print drive roller, bail springs 146 are connected between the side plates 90 and 92 respectively and the ends of the shaft 138. The bail springs are connected to draw the shaft 128 downwardly in the slots 132 and 134 toward the print drive roller.

The print drive roller 136 is driven by the main drive shaft 110 through a drive gear 148 which is mounted on an end of the print drive roller shaft that extends through the side plate 92. The drive gear 148 is in turn driven by an end of the main drive shaft 110 which extends through the side plate 92 and engages the drive gear. This end of the main drive shaft is flattened to provide a flat sided blade 150 similar in form to a screw driver blade. As will be noted in FIG. 7, this flat sided blade engages the teeth of the drive gear 148 to move the gear as the main drive shaft 110 rotates. The blade cooperates with an index spring 152 mounted upon the side plate 92 to move the drive gear 148 to a position where it is held by the index spring.

When the stepper motor 98 drives the main drive shaft 110, the blade 150 causes controlled rotation of the print drive roller 136, while the cam 112 positions the printer assembly 116 longitudinally along the main drive shaft. This is accomplished by a cam follower 154 which engages the cam face 114 of the cam 112 to cause lateral movement of the printer assembly, and a spring 156 mounted on the drive shaft 110 biases the printer assembly to the left in FIG. 5 so that the cam follower is maintained in contact with the cam face. As the cam 112 causes the printer assembly 116 to move to the right in FIG. 5, the spring 156 is compressed. It will be noted that the pinch rollers 130 are spaced apart for a distance sufficient to permit full lateral movement of the printer assembly to the extent provided by the cam face 114.

Figure 8:
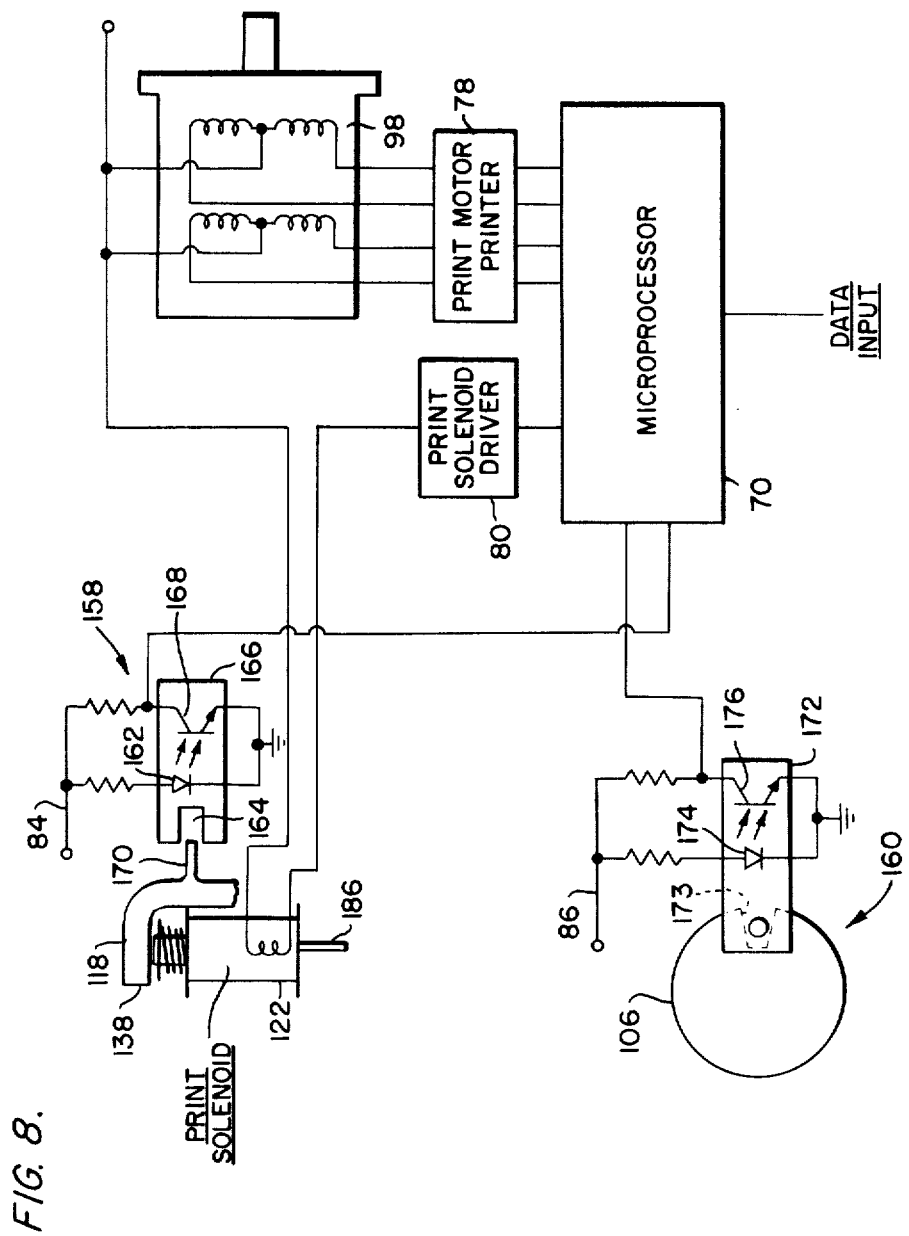
FIG. 8 is a block diagram of the electronic circuit for the moving dot matrix printer of FIG. 5.

The control circuit for the moving dot matrix printer 56 may best be understood with reference to FIG. 8. Here, it will be noted that the printer timing and character generation functions are controlled by a microprocessor, which may be the same microprocessor 70 employed with the measuring circuit on the measuring circuit and indicator card 60. This microprocessor may constitute an 8048 or 8748 single chip microprocessor manufactured by Intel Corporation and programmed for both measurement and print control functions. On the other hand, the microprocessor for the printer 56 may be a self contained microprocessor constituting a portion of the printer proper, and in this case the microprocessor might receive data at a data input from a measuring circuit microprocessor such as the microprocessor 70 or from some other data source. In instances where the main measuring unit microprocessor is not employed in the printer and the printer is provided with a self contained microprocessor, the printer microprocessor could still constitute a single chip microprocessor having character matrix dot patterns stored in a non volatile memory. Otherwise the measuring circuit microprocessor is programmed and designed to control the printer 56.

Before the microprocessor initiates character printing, it must first determine whether a ticket or other record medium has been inserted into the printer 56 through the slot 44, and it must also determine whether or not the cam 112 is in the proper starting position. This information is provided to the microprocessor by a ticket insertion detector 158 and a synchronization detector 160. The ticket insertion detector 158 includes a light source, such as a light emitting diode 162, which transmits light across a slot 164 in a sensing block 166 to a light sensitive transistor or similar solid state device 168. The sensing block is mounted on the power supply circuit board 58 in such a manner that the slot 164 is positioned behind the carriage 118 and is directly aligned with a blade 170 extending from the rear side of the carriage. When the carriage is tilted about the main drive shaft 110 by the push button 50 to accomplish the insertion and positioning of a record medium below the solenoid operated printer assembly 116, the blade 170 enters the slot 164 and prevents light from the light emitting diode 162 from reaching the light sensitive transsitor 168. This provides a ticket insertion signal on the line 74 to the microprocessor 70.

Similarly, the synchronization detector 160 includes a sensing block 172 which is suitably mounted upon the power supply circuit board 58 to sense the position of the cam 112. This may be done by either sensing the position of a notch provided in a flange directly on the cam 112, or, as in the case of the unit of FIG. 5, by sensing the position of a notch 173 cut in the flange 106. The synchronization detector includes a light emitting element, such as a light emitting diode 174, positioned by the sensing block 172 on one side of a slot 175 which receives the flange 106, and a light sensitive transistor 176 positioned by the sensing block on the opposite side of the flange 106. With the slot 173 and therefore the cam 112 in the proper starting position, the light from the light emitting diode 174 will strike the transistor 176 and provide a proper position signal on the line 76 to the microprocessor 70.

Figure 9:
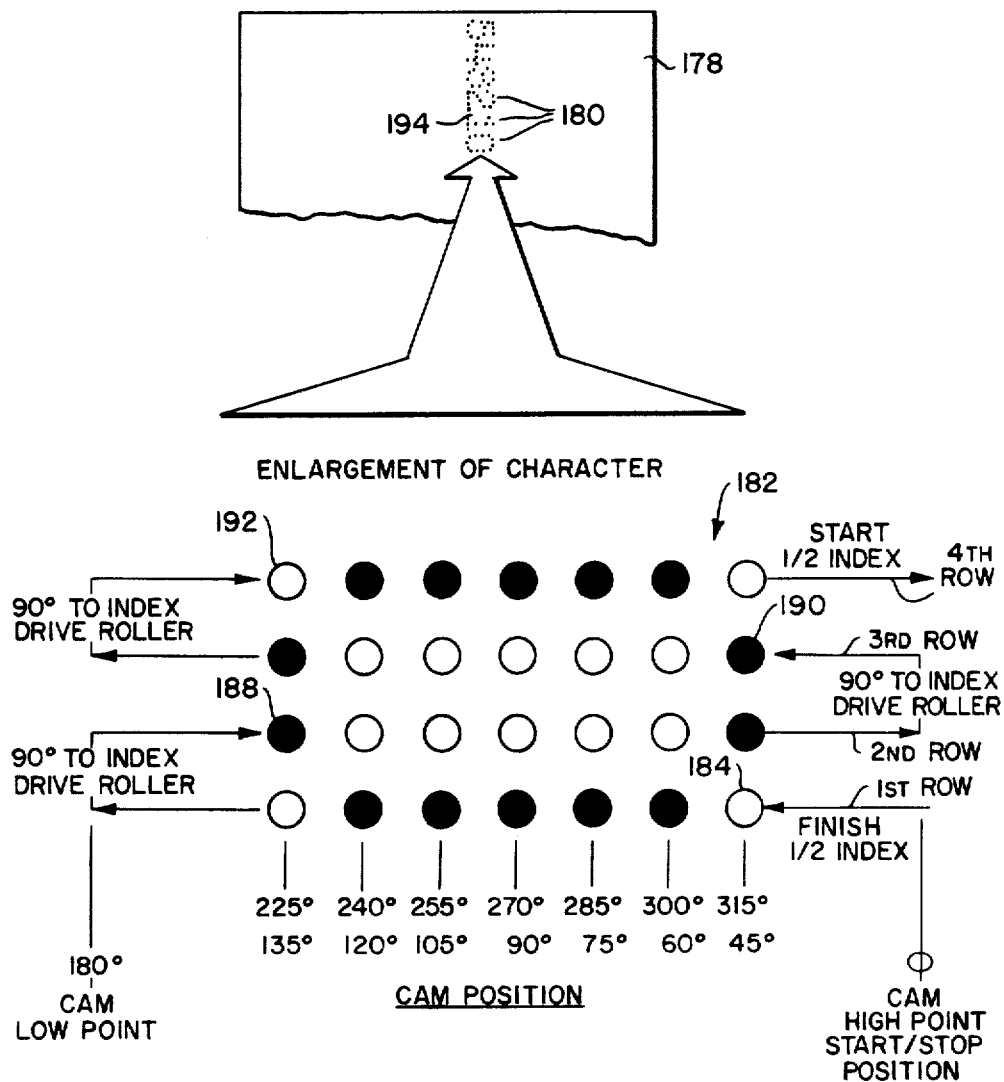
FIG. 9 is a diagram disclosing the mode of operation of the moving dot matrix printer of FIG. 5.

As illustrated in FIG. 9, the moving dot matrix printer 56 operates to print a character within a dot matrix on the record medium illustrated at 178. In FIG. 9, each character 180 formed on the record medium is formed within a seven by four dot matrix 182. For simplicity, the seven by four dot matrix has been used for illustration but obviously larger dot matrices can be formed in the same manner by programming the microprocessor 70 to add additional dot rows.

Similarly, the slope of the cam face 114 determines the character height, while the character width is determined by the diameter of the drive gear 148 and the drive roller 136. These parameters can be changed to vary both the height and the width of the character formed within any specific dot matrix.

To activate the printer 56, the print button 52 is depressed to rotate the carriage 118 about the main drive shaft 110, and a ticket or other record medium is inserted until it engages the stop 144. When the print button is then released, the blade 170 leaves the slot 164 and a signal is sent to the microprocessor 70 to indicate that a ticket is in a position for printing. When the microprocessor program recognizes that a ticket has been inserted, that input data has been stored, and that the high point of the cam surface 114 is in the proper start position, printing will begin. If, however, the cam 112 is not in the proper start position so that the notch 173 is not aligned with the light emitting diode 174, the microprocessor will cause the stepper motor 98 to rotate the main drive shaft 110 until the cam is in the proper start position and a start signal is received from the synchronization detector 160.

Once the cam 112 is in the proper start position, and the print button 52 has been released, printing automatically begins. The printer assembly 116 is first linearly deflected along the main drive shaft 110 from right to left in FIG. 5 by the rotation of the cam 112 and is then returned back from left to right as the cam continues to rotate. The direction of movement reverses during each half revolution of the cam, and during the middle 90° of each half revolution, the vertical dots required for each row to form the character are marked. The other 90° of motion, symmetrical about the cam high and low points, is used to drive the ticket to the correct row position to provide good character form.

The stepper motor 98 rotates the cam $7\frac{1}{2}°$ per step starting from the high point of the cam which is top dead center. The cam translates angular into a linear displacement causing the printer assembly 116 to move 0.01 inches per step. To form the first row of dots indicated at 184, the cam follower 154 moves down the cam surface to impart the initial right to left movement of the printer assembly. During the first 45° of cam displacement, the blade 150 engages the gear 148 and causes the drive roller 136 to index the record medium at an initial print position beneath the printer assembly 116. At this point, the blade 150 is rotated to a point where it is completely disengaged from the teeth of the gear 148 and, at this 45° point of the cam, the microprocessor 70 makes the first dot print decision. With the blade 150 remaining in the disengaged position relative to the drive gear 148 and the index spring 152 between the teeth of the drive gear to maintain positive positioning of the record medium, the stepper motor 98 continues to step the cam 112. For each 15° of cam rotation which constitutes a 0.02 inch displacement of the printer 116, the microprocessor 70 makes a determination as to whether a dot is to be printed. If a dot is to be printed, the microprocessor operates through the print solenoid driver 80 to energize the print solenoid 122. This causes a solenoid driven dot marker 186 to provide a dot on the record medium. The dot marker may constitute any unit for making a single dot impression on either plain or specially treated record paper by thermal, impact, light, or electric current application.

Once the cam 112 has been stepped from the 45° point to the 135° point, and a total of seven potential dot decisions have been made for the line 184, the cam will have reached the end of the first line. During the next 90° of rotation of the cam from the 135° point to the 225° point, the low point on the cam is passed and the blade 150 reengages the drive gear 148 and indexes the drive roller 136 so that the record medium is driven outwardly to bring the record medium into line for the formation of the second row of dots indicated at 188. For purposes of illustration, the gear 148 is indexed for one tooth or 0.02 inches, again leaving the index spring 152 positioned between the gear teeth to insure correct positioning for the row of dots 188.

After the cam low point at 180° of rotation has passed, the cam reverses the direction of travel of the printer assembly 116 so that the printer now moves from left to right in FIG. 5. Before the 225° point on the cam, the blade 150 has moved out of contact with the drive gear 148, and again the printer assembly moves across the record medium with a print decision being made every 15°. After the cam has traversed 90° to the 315° point, the second row of dots is completed and during the next 90° of rotation of the cam from the 315° point to the 45° point, the drive roller 136 is again indexed to move the record medium outwardly. During this indexing from 315° to 45°, the cam 0° or high point is passed, and the direction of movement of the printer assembly 116 is again reversed so that the printer assembly again moves from right to left in FIG. 5. Now the complete process described in connection with lines 184 and 188 is reinstituted to complete lines 190 and 192.

When the cam 112 reaches the 315° position completing the fourth row 192 in FIG. 9, the cam will return to top dead center in the final 45° of travel. During this final 45°, the blade 150 again engages the drive gear 148 and a one half index of the drive gear occurs. However, once the cam reaches the top dead center position and the seven by four dot matrix 182 is completed, the microprocessor 70 causes the stepper motor 98 to rotate the drive shaft 110 to complete one full cycle of revolution of the cam without activation of the print solenoid 122. This causes the blade 150 and drive gear 148 to move the drive roller 136 through two index positions to either create a space shown at 194 between the characters imprinted upon the record medium 178 or, if the final character has been printed, to eject the record medium from between the pinch rollers 130 and the drive roller 136 so that the record medium may be withdrawn from the slot 44.

As previously indicated, the size of the matrix 182 can be altered by altering the program of the microprocessor 70. For example, a five instead of a four line matrix can be formed by having the printer print an additional line. Also, nine instead of seven dots can be included in a line by adding dot decision points at 30°, 150°, 210°, and 330° of the cam. Although the stepper motor 98 having a step angle of 7$\frac{1}{2}$° was found to be efficient, any motor step angle can be accommodated by adjusting the slope of the cam 112 to maintain dot spacing and character height. The character form is determined by a code tabulation stored in the non volatile memory of the microprocessor and addressed by the input data character to be printed. The microprocessor program compensates for the alternate right to left and then left to right dot row printing by feeding the print solenoid driver 80 from alternate ends of an internal microprocessor register.

The moving dot matrix ticket printer 56 forms a chasis for the power supply circuit board 58 and the measuring and indicator circuit board 60, and combines with these two circuit boards to form a completely operative measuring and printing module separate from the housing 12. No structure contained upon the housing 12 is required to accomplish operation of the measuring and printing module formed by the printer 56 and the boards 58 and 60, and this module may be removed from the housing 12 and still be completely operable.

Figure 10:
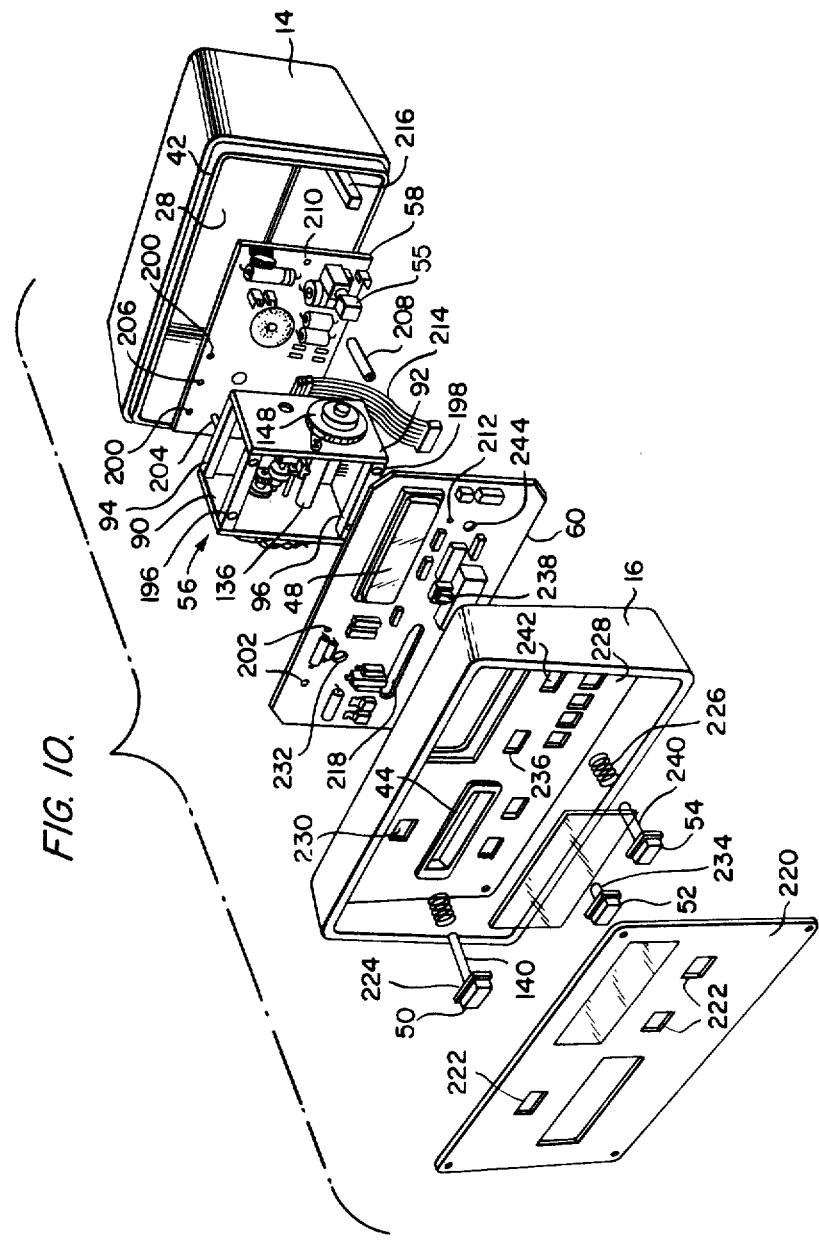
FIG. 10 is an exploded view of the electronic measuring and printing unit of the present invention.
Figure 11:
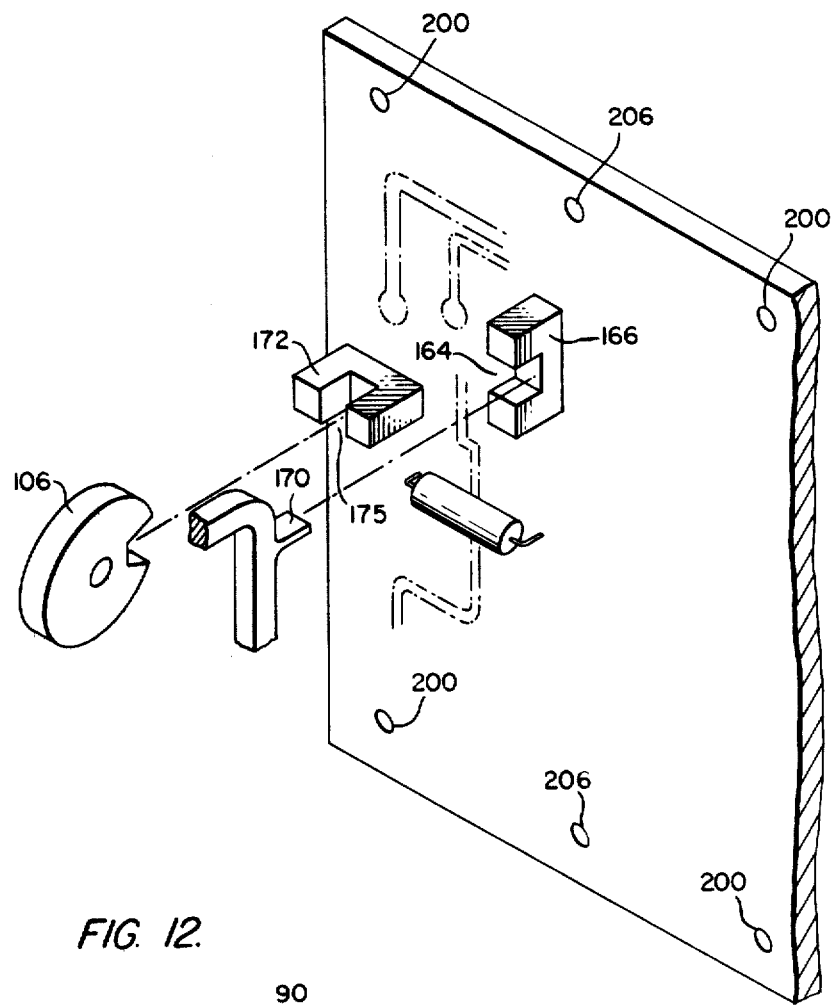
FIG. 11 is an exploded section of the power circuit board of FIG. 10 in combination with the detectors of FIG. 8.

Referring to FIG. 10, it will be noted that the spacing bars 94 and 96 which extend between the side plates 90 and 92 of the moving dot matrix ticket printer are provided respectively with outwardly facing threaded apertures 196 and 198 that are adapted to align with holes 200 and 202 formed in the power circuit board 58 and the measuring and indicator circuit board 60 respectively. Threaded screws or other suitable fasteners may then be inserted through the holes 200 and 202 and threaded into the apertures 196 and 198 to attach the circuit boards 58 and 60 to the printer 56. It is imperative that the power circuit board be carefully aligned with the printer, as the power circuit board carries the sensing blocks 166 and 172 (FIG. 11). Since the slot 164 in the sensing block 166 must be aligned with the blade 170 on the carriage 118 while the slot 175 in the sensing block 172 must be aligned to receive the flange 106, the power circuit board 58 must be carefully positioned with respect to the printer 56. To achieve this position, the upper and lower spacing bars 94 and 96 which engage the power circuit board 58 are each provided with rearwardly projecting locator pins 204 which project into locator holes 206 provided in the power circuit board between the holes 200. This insures alignment of the power circuit board and the sensing blocks 166 and 172 with corresponding components of the printer.

After the power circuit board 58 and the measuring and indicator circuit board 60 are secured to the printer 56, a tubular spacer 208 having a threaded aperture at each end may be positioned between the free ends of the power circuit board and the measuring and indicator circuit board in alignment with holes 210 and 212 therein. This spacer may then be secured by threaded screws or other fasteners inserted through the holes 210 and 212 and into the spacers, thereby creating a very rigid assembly. Now a flat belt type connector 214 which is secured to the power circuit board 58 may be passed beneath the printer 56 and secured to a proper socket (not shown, on the measuring and indicator circuit board 60 to complete the power and other connections thereto.

The operational module formed by the printer 56, the power circuit board 58, and the measuring and indicator circuit board 60 may easily be inserted within the enclosure 28 in the first housing assembly 14 and is positioned and supported therein by locator bars 216 formed in the first housing assembly. It will now become apparent that when the second housing assembly 16 is secured to the first housing assembly, the slot 44 will align with a slot 218 in the measuring and indicator circuit board 60 which in turn is aligned with the juncture between the drive roller 136 and the pinch rollers 130. Thus, a ticket inserted through the slot 44 will pass through the slot 218 and between the pinch rollers 130 and drive roller 136 until the ticket engages either the stop 144 or, in the absence of such stop, engages the power circuit board 58.

As previously stated, the print button 50, zero button 52, and power on/standby button 54 are removed from the first housing assembly 14 with the second housing assembly 16. One method for accomplishing this may be to provide the second housing assembly with a face plate 220 provided with apertures 222 which are dimensioned to permit only a portion of the buttons 50, 52 and 54 to project therethrough. Each of these buttons may be provided with a flange 224 which contacts the face plate 220 and limits the outward projection of the buttons through the apertures 222. Biasing springs 226 for biasing these buttons outwardly may be retained between the face plate 220 and a rear wall 228 on the second housing assembly which cooperates with the face plate to form the recessed face plate 40. The face plate 220 and rear wall 228 are arranged to permit limited inward movement of the buttons 50, 52 and 54.

It has previously been indicated that the print button 50 includes an extension rod 140 which operates, when the print button is depressed, to contact the flat area 138 on the printer carriage 118. This extension rod extends through an aperture 230 in the rear wall 228 and an aperture 232 in the measuring and indicator circuit board 60 to reach the printer 56.

Similarly, the zero button 52 is provided with a short extension rod 234 which extends through an aperture 236 in the rear wall 228 and which contacts a zero control button 238 on the measuring and indicator circuit board.

Finally, the power on/standby button 54 is provided with an extension rod 240 which extends through an aperture 242 in the rear wall 228 and an aperture 244 in the measuring and indicator circuit board 60 to the power switch 55 mounted upon the power circuit board 58.

To achieve effective operation of the modular, portable, electronic measuring system and printing unit 10 in the manner described, the single chip microprocessor 70 may be programmed in accordance with the following program. If the moving dot matrix ticket printer 56 includes a self contained microprocessor 70 and is employed as a separte unit, this microprocessor program would then begin at line 776 of the following program.

When the moving dot matrix printer 56 is combined in the modular system 10 of FIG. 1, an extremely compact and efficient measuring and printing unit is provided. Other aspects and advantages of the present invention will be readily apparent from a consideration of the specification and the appended drawings.

```
LOC  OBJ      LINE     SOURCE STATEMENT

1   $MACROFILE
               2   $XREF
               3   $PRINT (LP PEBALL LST)
               4   $TITLE('PRINTING ELECTRONIC BEAM')
               5        ;*****************************************
               6        ;*       MEMORY MAP                      *
               7        ;* LABEL      ADDRESS    DESCRIPTION     *
               8        ;*                                       *
               9        ;* FIX0       3F         FIXED ZERO      *
              10        ;* BCDLO & BCD 3E        1) BCD FROM A/D STORE
              11        ;*            3D         2) DISPLAY BCD REG
              12        ;*            3C                         *
              13        ;*            3B                         *
              14        ;* BCDHI      3A                         *
              15        ;*        ***************************    *
              16        ;* RABINL &   39         1) UNMODIFIED BINARY (A/D O/P)
              17        ;* BINARY     38         2) BINARY FOR BCD CONV
              18        ;* RABINH     37                         *
              19        ;*            36                         *
              20        ;*        ***************************    *
              21        ;* BINZ       35         ZERO REF REG    *
              22        ;*            34                         *
              23        ;*            33                         *
              24        ;*        ***************************    *
              25        ;* ABSR      32         ABSOLUTE ACCUM RESULT
              26        ;*            31                         *
              27        ;*            30                         *
```

```
LOC OBJ    LINE    SOURCE STATEMENT

28      ;*       2F                                              *
           29      ;*       2E                                              *
           30      ;*       ****************************                    *
           31      ;* CAZTC 2D       ZERO BAND CTR                          *
           32      ;*       ****************************                    *
           33      ;* SPANF 2C       1/ SPAN FACTOR REGISTER                *
           34      ;*       ****************************                    *
           35      ;* SPABIN 2B      1/SPANNED BINARY REG                   *
           36      ;*       2A                                              *
           37      ;*       29                                              *
           38      ;*       28                                              *
           39      ;*       27                                              *
           40      ;*       ****************************                    *
           41      ;* BIN4  26                                              *
           42      ;*       25       ZERO CORRECTED ACCUM RESULT REG        *
           43      ;*       24                                              *
           44      ;*       23                                              *
           45      ;*       ****************************                    *
           46      ;* CYCTR 22       CYCLE CTR REG                          *
           47      ;*       ****************************                    *
           48      ;* RDFACT 21      STORES 1,2 OR 5 FACTOR                 *
           49      ;*       ****************************                    *
           50      ;* BALCHK 20      BALANCE CHK REG                        *
           51      ;*       1F                                              *
           52      ;*       1E                                              *
           53      ;*       ****************************                    *
           54      ;* PREV  1D       PREV RESULT REG                        *
           55      ;*       1C                                              *
           56      ;*       1B                                              *
           57      ;*       1A                                              *
           58      ;* FFILT 19       FAST FILTER CTR                        *
           59      ;****************************************************
           60      ;****************************************************
           61      ;              PORT 1 I/O CONTROL CODES
           62      ;                       '0'     '0'     '1'     '0'     '0'
           63      ;              ENBLS  ENABLES ENABLES  BLANK  ENABLES ENABLES
           64      ;BAL   OIML   ZERO    SPAN &   A/D &  DISPLAY DISPLAY PRINTER
           65      ;SW    BAL    LIMIT   RDING   ZERO SW
           66 ;BIT #   7      6      5      4      3      2      1      0
           67      ;****************************************************
           68
           69
           70      ;PCB DIP SWITCH FUNCTION CHART
           71
           72
           73      ;****************************************************
           74      ;FUNCTION              SWITCH #    PORT    BIT #   ENABLE (P1)
           75
           76      ;SPAN SWTCH '1' BIT      1-1         0       0     SPARD
           77      ;            '2' BIT     1-2         0       1     SPARD
           78      ;            '4' BIT     1-3         0       2     SPARD
           79      ;            '8' BIT     1-4         0       3     SPARD
           80
           81      ;AZT BAND 1/2 GRAD       2-1         0       4     EAZTB
           82      ;         1 GRAD         2-2         0       5     EAZTB
           83      ;         2 GRAD         2-3         0       6     EAZTB
           84
           85      ;BAL TOL 1 OR 3 GRADS    2-4         1       7     SPARD (ADDRESS)
           86
           87      ;FIXED ZERO SELECT       2-5         0       7     SPARD
           88
           89      ;ROUNDING BY 2           2-6         0       6     ZADD
```

```
LOC  OBJ        LINE     SOURCE STATEMENT

90              ;ROUNDING BY 5        2-7        0    7    ZADO
                 91      ;*********************************************************
                 92
                 93
                 94      $EJECT
                 95
                 96
                 97
0000             98              ORG     0
                 99      $INCLUDE (:F1:PUPTST.SR)
              = 100      ;*********************************************************
              = 101      ;TWO MINUTE POWER UP TEST AND DELAY ROUTINE
              = 102      ;RESETS RAM & OUTPUTS
              = 103      ;DISABLES ALL INPUTS
              = 104      ;THEN DISPLAYS 10 TIMES THE FOLLOWING:
              = 105      ;1) CONVERTER O/P FOR 10 SECS
              = 106      ;2) 8'S FOR 1 SEC
              = 107      ;3) BLANKS FOR 1 SEC
              = 108      ;THEN FINALLY BLANKS & AWAITS REZERO
              = 109      ;R0 (RB1) - FLAG FOR DISPLAY CONV RET
              = 110      ;R2       - CYCLE CTR
              = 111      ;R3       - DISPLAY PRESET REG
              = 112      ;R4       - LOOP CTR
              = 113      ;*********************************************************
              = 114
              = 115
0000 B93F     = 116              MOV     R1,#BCD+1
0002 BF28     = 117              MOV     R7,#028H
0004 74AF     = 118              CALL    PCLR            ;CLEAR RAM
0006 B5       = 119              CPL     F1              ;SET FLAG TO RET FROM PATOD
0007 BA00     = 120              MOV     R2,#0           ;SET FOR 16 CYCLES (1 MIN DLY)
0009 0422     = 121 CONVA:       JMP     START           ;GO READ CONVERTER
000B FA       = 122 DCON:        MOV     A,R2            ;CHK WHAT TO DISPLAY
000C 7216     = 123              JB3     PUPDW           ;EA 2ND 8 CYCLES DISP WT (1.6 SEC)
000E BB08     = 124              MOV     R3,#8           ;OTHER 8 DISP ALTERN. 8 FOR .4 SEC
0010 3214     = 125              JB1     PUPDT
0012 BB0F     = 126              MOV     R3,#0FH         ;OR BLANK FOR .4 SEC
0014 7467     = 127 PUPDT:       CALL    FORD            ;GO DISP 8 OR BLANK
0016 748E     = 128 PUPDW:       CALL    DISP            ;GO DISP WT OR 8 OR BLANK
0018 EA09     = 129              DJNZ    R2,CONVA
001A 23F3     = 130              MOV     A,#ZADO
001C 39       = 131              OUTL    P1,A            ;READ ZERO SW STATUS
001D A5       = 132              CLR     F1              ;RESET RET FROM CONV FLAG
001E 85       = 133              CLR     F0              ;CLR FLAG TO SET FOR REZERO
001F 08       = 134 PONZ:        INS     A,BUS
0020 B21F     = 135              JB5     PONZ            ;THEN AWAIT REZERO
              = 136      $EJECT
                137      $INCLUDE (:F1:PATOD.SR)
              = 138
              = 139
              = 140      ;************************************
              = 141      ;READ SILICONIX A/D CONVERTER O/P
              = 142      ;DETECTS FIRST DIGIT STROBE (D5=MSD)
              = 143      ;READS IN DIGIT THEN TIMES TO MIDDLE
              = 144      ;OF EACH SUCCESSIVE DIGIT STROBE &
              = 145      ;READS IN DIGITS. LOOKS FOR ZERO OR
              = 146      ;OVERLOAD WHILE WAITING FOR D5
              = 147      ;R0 - PTS TO BCD I/P REG
              = 148      ;R7 - USED AS BYTE CTR
              = 149      ;************************************
              = 150
              = 151
```

```
LOC  OBJ      LINE         SOURCE STATEMENT

00F3          = 152   ZADO   EQU    0F3H        ;ENABLE READ OF A/D, ZERO SW & OVERLOAD
              = 153
              = 154
0022 23F3     = 155 START:   MOV    A,#ZADO
0024 39       = 156          OUTL   P1,A                    ;ENABLE A/D I/P
0025 BE06     = 157          MOV    R6,#6                   ;SET FOR 6 TIMER PERIODS (0.2 SEC DLY)
0027 08       = 158 WAIT6:   INS    A,BUS                   ;CHK FOR OVERLOAD
0028 BB00     = 159          MOV    R3,#00H                 ;(LOAD CODE FOR BARS INCRSE)
002A 92F0     = 160          JB4    OVERLD                  ;EACH LOOP
002C B22F     = 161          JB5    REMZ                    ;IF ZERO SW NOT PUSHED LEAVE FLAG SET
002E 85       = 162          CLR    F0                      ;IF SO CLR FLAG TO SET FOR REZERO
002F 27       = 163 REMZ:    CLR    A                       ;SET FOR 33.3 MS / LOOP
0030 74B6     = 164          CALL   TIMER
0032 EE27     = 165          DJNZ   R6,WAIT6
0034 8638     = 166 END5:    JNI    DIG5                    ;TEST IF STOBE IS LOW
0036 0434     = 167          JMP    END5                    ;IF STROBE IS HIGH LOOP
0038 08       = 168 DIG5:    INS    A,BUS                   ;& READ STATUS ZERO SW & O/L
0039 8638     = 169          JNI    DIG5                    ;KEEP CHKING TILL D5 STROBE OCCURS
003B 23FF     = 170          MOV    A,#-1                   ;LOAD TIMER FOR 130 MICRO SEC DLY
003D B83A     = 171          MOV    R0,#BCDLO-4             ;PT TO HIGH BYTE I/P REG
003F BF05     = 172          MOV    R7,#5                   ;SET FOR 5 DIGITS
0041 74B6     = 173 BCDLD:   CALL   TIMER                   ;DELAY TO READ DIGIT IN MIDDLE OF EA STROBE
0043 08       = 174          INS    A,BUS                   ;READ IN DIGIT
0044 530F     = 175          ANL    A,#00FH                 ;MASK OUT 4 HIGH BITS &
0046 A0       = 176          MOV    @R0,A                   ;LOAD IN I/P REG
0047 18       = 177          INC    R0                      ;PT TO NEXT BYTE
0048 23FD     = 178          MOV    A,#-3                   ;LD TIMER FOR 520 MICROSEC DLY BETWEEN STROBES
004A EF41     = 179          DJNZ   R7,BCDLD                ;READ ALL 5 DIGITS
004C 27       = 180          CLR    A
004D A0       = 181          MOV    @R0,A                   ;SET FIXED ZERO FOR TEST CYCLE
004E 760B     = 182          JF1    DCON                    ;IF WARMUP RET TO THAT ROUTINE
              = 183 $EJECT
              184 $INCLUDE (:F1:PEBCON.SR)
              = 185
              = 186         ;********************************************************
              = 187         ;5 DIGIT BCD TO 2 BYTE BINARY CONVERSION (65,535 MAX)
              = 188         ;USES TABLE OF CONSTANTS & REPETATIVE ADD
              = 189         ;OF CONSTANT A NUMBER OF TIMES SET BY BCD DIGIT VALUE
              = 190         ;********************************************************
              = 191
              = 192
003E          = 193          BCDLO  EQU    03EH             ;BCD LSD
003A          = 194          BCDHI  EQU    03AH             ;BCD MSD
0039          = 195          RABINL EQU    039H             ;BINARY RESULT LOW BYTE
0036          = 196          RABINH EQU    036H             ;BINARY RESULT HIGH BYTE
              = 197         ;R0 BCD DIGIT PTR
              = 198         ;R1 BINARY RESULT BYTE PTR
              = 199         ;R2 N/U
              = 200         ;R3 LOW BYTE CONV FACTOR STORE
              = 201         ;R4 HIGH BYTE CONV FACTOR STORE
              = 202         ;R5 DIGIT CTR
              = 203         ;R6 CONV FACTOR TABLE PTR
              = 204         ;R7 BCD DIGIT DEC CTR
              = 205
0050 B939     = 206 PEBCON:  MOV    R1,#RABINL              ;CLR BINARY RESULT MEM
0052 BF04     = 207          MOV    R7,#4                   ;& PT TO LOW BYTE
0054 74AF     = 208          CALL   PCLR
0056 B939     = 209          MOV    R1,#RABINL
0058 B83E     = 210          MOV    R0,#BCDLO               ;PTR TO BCD LSD
005A BEF6     = 211          MOV    R6,#LOW BINTAB          ;PTR TO LSD CONV FACTOR
005C BD05     = 212          MOV    R5,#5                   ;SET DIGIT CTR
005E FE       = 213 AGIN:    MOV    A,R6                    ;LOAD CONV FACTOR PTR
```

```
LOC  OBJ      LINE       SOURCE STATEMENT

005F E3       = 214      MOVP3  A,@A              ;THEN USE ACCUM TO
0060 AC       = 215      MOV    R4,A              ;LOAD R4 WITH HIGH BYTE
0061 1E       = 216      INC    R6
0062 FE       = 217      MOV    A,R6              ;PT TO LOW BYTE
0063 E3       = 218      MOVP3  A,@A              ;OF CONV FACTOR
0064 AB       = 219      MOV    R3,A              ;& LOAD IN R3
0065 F0       = 220      MOV    A,@R0             ;LOAD BCD DIGIT DECREMENT CTR
0066 AF       = 221      MOV    R7,A              ;CHK IF DIGIT ZERO
0067 C673     = 222      JZ     DIG0              ;IF SO SKIP ADDING FACTOR
0069 FB       = 223 DCONV: MOV  A,R3              ;IF NOT ADD CONV FACTOR
006A 61       = 224      ADD    A,@R1             ;& BINARY RESULT LOW BYTES
006B A1       = 225      MOV    @R1,A             ;&STORE IN RESULT MEM
006C C9       = 226      DEC    R1
006D F1       = 227      MOV    A,@R1             ;ADD HIGH BYTES & STORE
006E 7C       = 228      ADDC   A,R4              ;IN BINARY RESULT MEM
006F A1       = 229      MOV    @R1,A             ;
0070 19       = 230      INC    R1                ;PT BACK TO LOW BYTE & REPEAT AS
0071 EF69     = 231      DJNZ   R7,DCONV          ;REQD FOR EACH BCD DIGIT
0073 1E       = 232 DIG0 INC    R6                ;PT TO NEXT CONV FACTOR
0074 C8       = 233      DEC    R0                ;PT TO NEXT BCD DIGIT
0075 ED5E     = 234      DJNZ   R5,AGIN           ;REPEAT FOR 5 BCD DIGITS
              = 235 $EJECT
              236 $INCLUDE (:F1:PEBSF.SR)
              = 237
              = 238      ;**********************************************
              = 239      ;LOOKS UP FACTOR BY WHICH BINARY VALUE MUST
              = 240      ;BE MULTIPLIED TO ACHIEVE CORRECT SPAN
              = 241      ;TABLE VALUES ARRANGED SO EACH SWITCH INC
              = 242      ;GIVES A 14% REDUCTION IN DISPLAYED WEIGHT
              = 243      ;THEN MULTIPLIES BY FACTOR TO GIVE
              = 244      ;SPANNED BINARY RESULT
              = 245      ;**********************************************
              = 246
              = 247
00FB          = 248      QUIES  EQU    0FBH       ;DISABLE INPUT/OUTPUT
00EB          = 249      SPARD  EQU    0EBH       ;READ SPAN & ROUNDING SW I/P'S
002C          = 250      SPANF  EQU    02CH       ;SPAN FACTOR REGISTER
002B          = 251      SPABIN EQU    02BH       ;SPANNED BINARY RESULT REG
              = 252
              = 253
0077 23EB     = 254      MOV    A,#SPARD          ;ENABLE SPAN SW I/P
0079 39       = 255      OUTL   P1,A
007A B82C     = 256      MOV    R0,#SPANF         ;PT TO SPAN FACTOR REG
007C 08       = 257      INS    A,BUS             ;READ SPAN & ROUNDING SW
007D 530F     = 258      ANL    A,#0FH            ;MASK OUT ROUNDING
007F 03E0     = 259      ADD    A,#LOW(SPANT)     ;PT TO SPAN FACTOR
0081 A3       = 260      MOVP   A,@A              ;FETCH
0082 A0       = 261      MOV    @R0,A             ;& STORE SPAN FACTOR
0083 62       = 262      MOV    T,A               ;SAVE SPANF FOR ZERO LIMIT CHK
0084 BB39     = 263      MOV    R3,#RABINL        ;PT TO MULTIPLICAND REG LOW BYTE
0086 BA2B     = 264      MOV    R2,#SPABIN        ;PT TO RESULT REG LOW BYTE
0088 7473     = 265      CALL   PBMULT            ;MULTIPLY BINARY VALUE BY SPAN FACTOR
              = 266
              = 267 $INCLUDE (:F1:RECYC.SR)
              1= 268     ;**********************************
              1= 269     ;CAUSES .2 SEC UPDATE RATE WHEN MORE
              1= 270     ;THAN 10 GRADS FROM BAL THEN WITHIN
              1= 271     ;10 GRADS GIVES 1.6 SEC UPDATE AS IT
              1= 272     ;ADDS SPANNED BINARY READING TO
              1= 273     ;ACCUMULATED RESULT REGISTER 8 TIMES
              1= 274     ;GIVING AN 8 CYCLE AVERAGE
              1= 275     ;R0 - PTS TO SPANNED BINARY REG
              1= 276     ;R1 - PTS TO ACCUMULATED RESULT REG
```

```
LOC  OBJ        LINE         SOURCE STATEMENT

1= 277          ;R7 - BYTE CTR
             1= 278          ;*****************************
             1= 279
0019         1= 280     FFILT  EQU    019H      ;FAST FILTER DLY CTR
0022         1= 281     CYCTR  EQU    022H      ;CYCLE CTR REG
001D         1= 282     PREV   EQU    01DH      ;PREV RESULT REG
             1= 283
             1= 284 $INCLUDE (:F1:SREADF.SR)
             2= 285          ;*********************************************
             2= 286          ;MULTIPLIES SINGLE READING BY 4 TO ALLOW FOR
             2= 287          ;QUICK UPDATE (0.2 SEC) AWAY FROM BALANCE
             2= 288          ;*********************************************
             2= 289
             2= 290
008A B939    2= 291 RECYC. MOV   R1,#RABINL   ;MOV TO TEMP REG FOR MULTIPLICATION
008C B82B    2= 292        MOV   R0,#SPABIN   ;,TO PROTECT VALUE
008E 74EA    2= 293        CALL  DMOV
0090 B82C    2= 294        MOV   R0,#SPANF    ;MULTIPLY SINGLE READING BY 8
0092 B004    2= 295        MOV   @R0,#4
0094 BA25    2= 296        MOV   R2,#BIN4-1   ;& STORE AS TEMP ABSOLUTE RESULT
0096 BB38    2= 297        MOV   R3,#RABINL-1
0098 7473    2= 298        CALL  PBMULT
             2= 299
             1= 300
009A BA25    1= 301        MOV   R2,#BIN4-1   ;LOAD ABS RES PTR
009C 7458    1= 302        CALL  SUBT         ;SUBTRACT PREV RESULT
             1= 303
009E BE10    1= 304        MOV   R6,#-240     ;CHK FOR SLOW FILTER RANGE
00A0 541C    1= 305        CALL  PBAL1        ;BAL IF A = 0
00A2 96D3    1= 306        JNZ   FABS         ;IF NOT GO UPDATE PREV RESULT
             1= 307
00A4 B819    1= 308        MOV   R0,#FFILT    ;CHK FAST FILTER DELAY CTR
00A6 F0      1= 309        MOV   A,@R0        ;IF ZERO GO ACCUM (SLOW UPDATE 1.6 SEC)
00A7 96D7    1= 310        JNZ   FDLYS        ;IF NOT GO DO ANOTHER FAST UPDATE
             1= 311
00A9 B822    1= 312 RECYC1. MOV  R0,#CYCTR    ;PT TO CYCLE CTR REG &
00AB 10      1= 313        INC   @R0          ;INCREMENT
00AC F0      1= 314        MOV   A,@R0
00AD AD      1= 315        MOV   R5,A         ;PUT IN TEMP STORE
00AE B932    1= 316        MOV   R1,#ABSR     ;PT TO ACCUM RESULT REG
00B0 B82B    1= 317        MOV   R0,#SPABIN   ;PT TO CURRENT READING
00B2 BF04    1= 318        MOV   R7,#4        ;SET FOR 4 BYTES
00B4 74A6    1= 319        CALL  BADD         ;& ADD TO ACCUM RESULT
             1= 320
00B6 FD      1= 321        MOV   A,R5         ;CHK IF 8 READINGS ACCUMULATED
00B7 03F8    1= 322        ADD   A,#0F8H
00B9 96D1    1= 323        JNZ   ANC
             1= 324
00BB BB2F    1= 325        MOV   R3,#ABSR-3   ;DIVIDE RESULT BY 2
00BD BA01    1= 326        MOV   R2,#1        ;(SET FOR 1 LOOP)
00BF 3408    1= 327        CALL  DVIDE
             1= 328
00C1 BA31    1= 329        MOV   R2,#ABSR-1   ;LOAD ABS RES REG PTR
00C3 7458    1= 330        CALL  SUBT         ;SUBTRACT PREV RESULT
             1= 331
00C5 B832    1= 332 GORE.  MOV   R0,#ABSR     ;LOAD VALUE AS NEW
00C7 B91D    1= 333        MOV   R1,#PREV     ;PREV RESULT
00C9 74EA    1= 334        CALL  DMOV
             1= 335
00CB B822    1= 336        MOV   R0,#CYCTR    ;RESET CYCLE CTR
00CD B000    1= 337        MOV   @R0,#0
             1= 338
```

| LOC OBJ | LINE | SOURCE STATEMENT | | | |
|---------|------|------------------|------|------|---|
| 00CF 2416 | 1= 339 | | JMP | PCALC | ;GO ZERO CORRECT & DISPLAY |
| | 1= 340 | | | | |
| 00D1 0422 | 1= 341 ANC: | | JMP | START | ;GO DO ANOTHER CONVERSION |
| | 1= 342 | | | | |
| 00D3 B819 | 1= 343 FABS: | | MOV | R0,#FFILT | ;SET # OF FAST CYLES DLY BEFORE |
| 00D5 B0F9 | 1= 344 | | MOV | @R0,#-7 | ;SWITCHING TO SLOW UPDATE (1.6 SEC) |
| 00D7 10 | 1= 345 FDLYS: | | INC | @R0 | ;INC DELAY CTR EACH TIME THRU |
| 00D8 B826 | 1= 346 | | MOV | R0,#BIN4 | ;LOAD 4 TIMES READING AS ABS RESULT |
| 00DA B932 | 1= 347 | | MOV | R1,#ABSR | |
| 00DC 74EA | 1= 348 | | CALL | DMOV | |
| 00DE 04C5 | 1= 349 | | JMP | GORE | ;GO UPDATE PREV RESULT THEN DISPLAY |
| | 1= 350 $EJECT | | | | |
| | = 351 | | | | |
| 00E0 00 | = 352 SPANT: | | DB | 0 | ;0     SPAN FACTOR |
| 00E1 DD | = 353 | | DB | 0DDH | ;.863 |
| 00E2 BD | = 354 | | DB | 0BDH | ;.738 |
| 00E3 A3 | = 355 | | DB | 0A3H | ;.637 |
| 00E4 8C | = 356 | | DB | 08CH | ;.547 |
| 00E5 78 | = 357 | | DB | 078H | ;.469 |
| 00E6 68 | = 358 | | DB | 068H | ;.406 |
| 00E7 59 | = 359 | | DB | 059H | ;.348 |
| 00E8 4D | = 360 | | DB | 04DH | ;.301 |
| 00E9 42 | = 361 | | DB | 042H | ;.258 |
| 00EA 39 | = 362 | | DB | 039H | ;.223 |
| 00EB 31 | = 363 | | DB | 031H | ;.191 |
| 00EC 2A | = 364 | | DB | 02AH | ;.164 |
| 00ED 24 | = 365 | | DB | 024H | ;.141 |
| 00EE 1F | = 366 | | DB | 01FH | ;.121 |
| 00EF 1B | = 367 | | DB | 01BH | ;.105 |
| | = 368 $EJECT | | | | |
| | 369 $INCLUDE (:F1.OVERLD.SR) | | | | |
| | = 370 | ;*********************************************** | | | |
| | = 371 | ;CAUSES BARS TO BE DISPLAYED FOR | | | |
| | = 372 | ;OVER CAPACITY | | | |
| | = 373 | ;SKIPS WT UPDATE,RESETS RESULT REG | | | |
| | = 374 | ;& CYCLE CTR EACH TIME | | | |
| | = 375 | ;*********************************************** | | | |
| | = 376 | | | | |
| 00F0 7467 | = 377 OVERLD: | | CALL | FORD | ;DISPLAY ALL BARS |
| 00F2 B932 | = 378 | | MOV | R1,#ABSR | ;CLR RESULT REG |
| 00F4 BF04 | = 379 | | MOV | R7,#4 | |
| 00F6 74AF | = 380 | | CALL | PCLR | |
| 00F8 B822 | = 381 | | MOV | R0,#CYCTR | |
| 00FA B000 | = 382 | | MOV | @R0,#0 | ;& CYCLE CTR |
| 00FC 0422 | = 383 | | JMP | START | ;GO CHK AGAIN |
| | = 384 $EJECT | | | | |
| | 385 $INCLUDE (:F1.RND.SR) | | | | |
| | = 386 | ;*********************************************** | | | |
| | = 387 | ;CHECK FRACTION WHEN REQD FOR FOLLOWING | | | |
| | = 388 | ;1) ROUND UP OR DOWN | | | |
| | = 389 | ;2) CHK IF WITHIN 0.5 GRAD ZERO | | | |
| | = 390 | ;3)CHK IF WITHIN 0.25 GRAD ZERO | | | |
| | = 391 | | | | |
| | = 392 | ;R7 - SETS MASK VALUE | | | |
| | = 393 | ;R6 - SETS LIMIT VALUE (FB OR FD) | | | |
| | = 394 | ;*********************************************** | | | |
| | = 395 | | | | |
| | = 396 | | | | |
| 00FE B925 | = 397 RND: | | MOV | R1,#BIN4-1 | ;FETCH FRACTION |
| 0100 F1 | = 398 | | MOV | A,@R1 | |
| 0101 A5 | = 399 | | CLR | F1 | |
| 0102 5F | = 400 | | ANL | A,R7 | ;MASK AS REQD BY R7 |
| 0103 6E | = 401 | | ADD | A,R6 | ;ADD LIMIT SET BY R6 |

```
0104 F607     = 402           JC      LOV           ;IF OVER DONT SET FLAG
0106 B5       = 403           CPL     F1            ;IF UNDER DO
0107 83       = 404 LOV:      RET
              = 405 $EJECT
                406
                407 $INCLUDE (:F1:DVIDE.SR)
              = 408           ;******************************************
              = 409           ;DVIDE - DEVIDES # PTD BY R3 BY 2 TO N
              = 410           ;VALUE OF N SET BY R2
              = 411           ;******************************************
              = 412
              = 413
0108 FB       = 414 DVIDE:    MOV     A,R3          ;
0109 A9       = 415           MOV     R1,A          ;LOAD PTR
010A 97       = 416           CLR     C             ;CLR CARRY
010B BF04     = 417           MOV     R7,#4         ;SET FOR 4 BYTES
010D F1       = 418 ABYTE:    MOV     A,@R1         ;GET BYTE
010E 67       = 419           RRC     A             ;SHIFT RIGHT
010F A1       = 420           MOV     @R1,A         ;STORE NEW VALUE
0110 19       = 421           INC     R1            ;PT TO NEXT LOWER BYTE
0111 EF0D     = 422           DJNZ    R7,ABYTE      ;DO ALL BYTES
0113 EA08     = 423           DJNZ    R2,DVIDE      ;DO N TIMES FOR REQD DIV
0115 83       = 424           RET
              = 425 $EJECT
                426 $INCLUDE (:F1:PCALC.SR)
              = 427
              = 428
              = 429
              = 430           ;******************************************
              = 431           ;DISPLAY CALCULATION DOES FOLLOWING :
              = 432           ;STORES FRACTION FOR ZERO 1/4 G TEST
              = 433           ;DEVIDES ACCUM RESULT BY 8 TO CORRECT
              = 434           ;ADDS 1 TO ROUND UP IF REQUIRED
              = 435           ;CONVERTS TO BCD IN DISPLAY REG
              = 436           ;THEN CLEARS ACCUM REG & CYCLE CTR
              = 437           ;R0 - PTS TO ZERO FRACTION REG
              = 438           ;R1 - PTS TO ACCUM RESULT REG
              = 439           ;R2 - DEVIDE REG
              = 440           ;R5 - TEMP STORE OF CYCLE CTR
              = 441           ;R7 - BYTE CTR
              = 442           ;******************************************
              = 443
              = 444
0035          = 445           BINZ    EQU     035H  ;LOW BYTE ZERO REF
0026          = 446           BIN4    EQU     026H  ;ZERO CORRECTED RESULT
0032          = 447           ABSR    EQU     032H  ;ABSOLUTE ACCUM RESULT
              = 448
              = 449
              = 450           ;******************************************
              = 451           ;       SUBTRACT ZERO REFERENCE
              = 452           ;       (ATER UPDATE IF REQD)
              = 453           ;       ZERO REF STORED IN THE
              = 454           ;       FORM OF COMPLEMENT+1
              = 455           ;******************************************
              = 456
              = 457
0116 B627     = 458 PCALC:    JF0     NZUD          ;IF NO ZERO REQ SKIP UPDATE
0118 95       = 459           CPL     F0            ;CANCEL ZERO REQUEST
0119 540A     = 460           CALL    PBAL          ;CHK IF BAL (A = 0)
011B 9627     = 461           JNZ     NZUD          ;IF NOT SKIP REZERO
011D 7400     = 462           CALL    ZLIMIT        ;GO CHK IF IN ZERO LIMIT RANGE
011F 9627     = 463           JNZ     NZUD          ;IF NOT SKIP REZERO
0121 B931     = 464 FIRZ:     MOV     R1,#ABSR-1    ;IF NOT PT TO ACCUM RES LOW BYTE
0123 B835     = 465           MOV     R0,#BINZ      ;& ZERO REF REG
```

```
0125 74DC    = 466        CALL  COMP1         ;IF REQ GO UPDATE ZERO REF
0127 B926    = 467 NZUD   MOV   R1,#BIN4
0129 B832    = 468        MOV   R0,#ABSR      ;LOAD IN ABSOLUTE ACCUM RESULT
012B 74EA    = 469        CALL  DMOV
012D BF03    = 470        MOV   R7,#3         ;SET FOR 3 BYTES THEN
012F B835    = 471        MOV   R0,#BINZ      ;SUBTRACT ZERO REF BY ADDING
0131 B925    = 472        MOV   R1,#BIN4-1    ;STORED COMPLEMENT + 1 VALUE
0133 74A6    = 473        CALL  BADD
             = 474 $INCLUDE (.F1.POL.SR)
            1= 475
            1= 476
            1= 477
            1= 478        ;******************************************
            1= 479        ;CHECKS IF RESULT OF ZERO REF SUBTRACT
            1= 480        ;IS NEGATIVE, IF SO TAKES COMP+1 TO
            1= 481        ;GIVE CORRECT NEG RESULT & SETS R4 TO
            1= 482        ;1 TO INDICATE SIGN
            1= 483        ;R4 - SIGN REG
            1= 484        ;R1 - PTS TO ACCUM RES REG
            1= 485        ;R0 - PTS TO ACCUM RES REG
            1= 486        ;******************************************
            1= 487
            1= 488
0135 BC00   1= 489 POL:   MOV   R4,#0         ;SET R4 FOR POS RESULT
0137 F640   1= 490        JC    AZTB          ;IF POS GO RET
0139 B925   1= 491        MOV   R1,#BIN4-1    ;IF NEG TAKE
013B B825   1= 492        MOV   R0,#BIN4-1    ;COMPLEMENT &
013D 74DC   1= 493        CALL  COMP1         ;ADD 1 FOR TRUE NEG RES
013F 1C     1= 494        INC   R4            ;SET R4 FOR NEG RESULT
            1= 495
             = 496 $INCLUDE (.F1.AZTB.SR)
            1= 497        ;******************************************
            1= 498        ;CHKS IF WITHIN AZT BAND BUT NOT AT ZERO
            1= 499        ;IF SO CAUSES ZERO UPDATE
            1= 500        ;ALSO,CANCELS MINUS INDICATOR AT ZERO
            1= 501        ;& SETS FOR 0.25 GRAD ZERO INDICATOR
            1= 502        ;R1 - PTS TO BINARY RES REG
            1= 503        ;R3 - TEMP STORE OF AZT BAND COMPLEMENT
            1= 504        ;R4 - STORE FOR SIGN STATUS
            1= 505        ;R6 - LIMIT REG
            1= 506        ;R7 - MASK REG
            1= 507        ;******************************************
            1= 508
            1= 509
002D        1= 510        CAZTC EQU   02DH    ;# OF TIMES IN AZT BAND CTR
00EB        1= 511        EAZTB EQU   0EBH    ;READ STATUS AZT BAND SWITCHES
            1= 512
            1= 513
0140 23EB   1= 514 AZTB:  MOV   A,#EAZTB      ;ENABLE AZT BAND SWITCHES
0142 39     1= 515        OUTL  P1,A          ;(SW SET TO COMP)
0143 08     1= 516        INS   A,BUS         ;READ IN BAND
0144 77     1= 517        RR    A
0145 77     1= 518        RR    A             ;SHIFT TO 0,5,1 & 2 BIT POSN'S
0146 43E3   1= 519        ORL   A,#0E3H       ;MASKOUT SPAN
0148 AB     1= 520        MOV   R3,A          ;SAVE
0149 B923   1= 521        MOV   R1,#BIN4-3
014B B82D   1= 522        MOV   R0,#CAZTC     ;PT TO AZTB CTR
014D F1     1= 523        MOV   A,@R1
014E BEFB   1= 524        MOV   R6,#0FBH      ;SET FOR 0.5 RND DOWN AWAY FROM ZERO
0150 9677   1= 525        JNZ   RSTAZ         ;CHK IF HIGH BYTES ARE ZERO
0152 19     1= 526        INC   R1            ;IF NOT RESET AZTB CTR & SKIP REZERO
0153 F1     1= 527        MOV   A,@R1
0154 9677   1= 528        JNZ   RSTAZ
0156 8FFF   1= 529        MOV   R7,#0FFH      ;SET FOR NO MASKOUT
```

```
0158 BEFC      1= 530            MOV    R6,#0FCH        ;SET 0.5 GRAD LIMIT
015A 14FE      1= 531            CALL   RND             ;CHK IF WITHIN 0.5 GRAD OF ZERO
015C F668      1= 532            JC     NOZO            ;IF NOT LEAVE SIGN STATUS
015E BC00      1= 533            MOV    R4,#0           ;IF SO CANCEL MINUS SIGN
0160 BEFE      1= 534            MOV    R6,#0FEH        ;SET 0.25 GRAD LIMIT
0162 14FE      1= 535            CALL   RND             ;CHK IF WITHIN 0.25 GRAD OF ZERO
0164 F668      1= 536            JC     NOZO            ;IF NOT LEAVE SIGN STATUS
0166 BC02      1= 537            MOV    R4,#2           ;IF SO SET R4 FOR 0.25 GRAD IND
               1= 538
               1= 539
0168 F1        1= 540 NOZO:      MOV    A,@R1           ;CHK IF ABSOLUTE ZERO
0169 BEFC      1= 541            MOV    R6,#0FCH        ;SET FOR 0.5 GRAD RND UP AT ZERO
016B C677      1= 542            JZ     RSTAZ           ;IF SO RESET AZTB CTR & SKIP REZERO
016D 6B        1= 543            ADD    A,R3            ;IF NOT CHK IF IN BAND
016E F677      1= 544            JC     RSTAZ           ;IF NOT RESET AZTB CTR & SKIP REZERO
0170 10        1= 545            INC    @R0             ;INC AZTB CTR
0171 F0        1= 546            MOV    A,@R0           ;THEN IF 1ST OR 2ND CYCLE IN AZT BAND
0172 1279      1= 547            JB0    NAZ             ;IF 1ST DONT AZT
0174 85        1= 548            CLR    F0              ;IF 2ND RESET FLAG FOR REZERO
0175 2416      1= 549            JMP    PCALC           ;& GO DO
               1= 550
               1= 551
0177 B000      1= 552 RSTAZ:     MOV    @R0,#0          ;RESET AZTB CTR TO ZERO
0179 BF07      1= 553 NAZ:       MOV    R7,#7           ;SET TO MASK OUT ALL BUT FRACTION
017B 14FE      1= 554            CALL   RND             ;GO ROUND
               1= 555 $EJECT
                = 556            ;************************************
                = 557            ;      DEVIDE ACCUM RESULT BY 8
                = 558            ;************************************
                = 559
                = 560
017D BA03       = 561            MOV    R2,#3           ;SET FOR 3 LOOPS
017F BB23       = 562            MOV    R3,#BIN4-3      ;PT TO HIGH BYTE
0181 3408       = 563            CALL   DVIDE           ;DIVIDE BY 8
                = 564
                = 565
                = 566            ;************************************
                = 567            ;      ROUNDING UP OR DOWN
                = 568            ;************************************
                = 569
                = 570
0183 768F       = 571            JF1    RDOWN           ;IF F1 SET DNT ADD 1
0185 B925       = 572            MOV    R1,#BIN4-1      ;IF IS PT TO RESULT LOW BYTE
0187 2301       = 573            MOV    A,#1            ;SET &
0189 61         = 574            ADD    A,@R1           ;ADD 1 TO RESULT
018A A1         = 575            MOV    @R1,A           ;& STORE BACK
018B C9         = 576            DEC    R1              ;PT TO NEXT BYTE
018C 27         = 577            CLR    A               ;CLR ACCUM
018D 71         = 578            ADDC   A,@R1           ;& ADD IN CARRY
018E A1         = 579            MOV    @R1,A           ;STORE BACK VALUE
                = 580
018F A5         = 581 RDOWN:     CLR    F1              ;CLR POWUP FLAG
                = 582
                = 583 $INCLUDE (:F1:BINBCD.SR)
               1= 584
               1= 585            ;************************************
               1= 586            ;       ***   16 BIT BINARY TO BCD    ***
               1= 587            ;       ***   MAX FF,FFH TO 65,525    ***
               1= 588            ;************************************
               1= 589
               1= 590            ;ALGORITHMN (((BN)2 + BN-1)2 + BN-3)2........+ BN-N
               1= 591
0010           1= 592            N      EQU    16       ;BINARY BITS IN CONVERSION
0038           1= 593            BINARY EQU    038H     ;BINARY REGISTER LEAST SIG BYTE
```

```
003E            1= 594          BCD     EQU     03EH    ;BCD CONVERSION REGISTER (6 PACKED BCD DIGITS)
0021            1= 595          RDFACT  EQU     021H    ;ROUNDING FACTOR REGISTER
                1= 596
                1= 597
                1= 598          ;CLEAR BCD CONVERSION REGISTER
                1= 599          ;**********************************
                1= 600
                1= 601
0190 BF06       1= 602 BINBCD   MOV     R7,#6           ;CLR 6 DIGIT BCD CONV REG
0192 B93E       1= 603          MOV     R1,#BCD
0194 74AF       1= 604          CALL    PCLR
                1= 605
                1= 606
                1= 607          ;ROUND BY 1,2 OR 5 THEN
                1= 608          ;PUT BINARY VALUE IN TEMPORY STORE
                1= 609          ;**********************************
                1= 610
                1= 611
0196 23F3       1= 612          MOV     A,#2AD0         ;ENABLE SPAN & RDING SW
0198 39         1= 613          OUTL    P1,A
0199 08         1= 614          INS     A,BUS           ;READ IN
019A 47         1= 615          SWAP    A
019B 530C       1= 616          ANL     A,#00CH         ;MASK OUT ALL BUT ROUNDING
019D 77         1= 617          RR      A               ;MULT SW VALUE BY 2
019E 32A1       1= 618          JB1     BY2             ;IF RESULT 2 LEAVE, IF 0 OR 4
01A0 17         1= 619          INC     A               ;ADD 1 FOR CORRECT RDING FACTOR
01A1 B821       1= 620 BY2      MOV     R0,#RDFACT      ;THEN SET PTR & STORE
01A3 A0         1= 621          MOV     @R0,A
01A4 BA38       1= 622          MOV     R2,#BINARY      ;PT TO TEMP RESULT REG
01A6 BB25       1= 623          MOV     R3,#BIN4-1      ;PT TO ACCUM RESULT REG
01A8 7473       1= 624          CALL    PBMULT          ;RD & PUT RESULT IN TEMP STORE
                1= 625
                1= 626
                1= 627          ;CONVERT BINARY TO PACKED BCD
                1= 628          ;*****************************
                1= 629
                1= 630
01AA BB10       1= 631          MOV     R3,#N           ;LOAD BIT COUNTER
                1= 632
01AC BA02       1= 633 BIN1     MOV     R2,#N/8         ;LOAD LOOP COUNTER
01AE B838       1= 634          MOV     R0,#BINARY      ;PTR TO BINARY LOW BYTE
01B0 B93E       1= 635          MOV     R1,#BCD         ;PTR TO BCD LSD
01B2 97         1= 636          CLR     C
                1= 637
01B3 F0         1= 638 BIN2     MOV     A,@R0           ;READ BINARY BYTE
01B4 F7         1= 639          RLC     A               ;ROTATE MOST SIG BIT INTO CARRY
01B5 A0         1= 640          MOV     @R0,A           ;RELACE DATA
01B6 C8         1= 641          DEC     R0              ;PTR = NEXT MOST SIG BINARY BYTE
01B7 EAB3       1= 642          DJNZ    R2,BIN2         ;DO "N/8" TIMES
                1= 643
01B9 BA03       1= 644          MOV     R2,#3           ;LOAD LOOP COUNTER
                1= 645
01BB F1         1= 646 BIN3     MOV     A,@R1           ;READ BCD DIGITS
01BC 71         1= 647          ADDC    A,@R1           ;ADD MOST SIG BINARY BIT TO TWICE BCD DATA
01BD 57         1= 648          DA      A               ;DECIMALIZE
01BE A1         1= 649          MOV     @R1,A           ;AND RESET BCD DIGITS
01BF C9         1= 650          DEC     R1              ;DEC TWICE SO
01C0 C9         1= 651          DEC     R1              ;PTR = NEXT MOST SIG BCD DIGITS
01C1 EABB       1= 652          DJNZ    R2,BIN3         ;DO "3" TIMES
01C3 EBAC       1= 653          DJNZ    R3,BIN1         ;DO UNTIL ALL BINARY BITS CONVERTED
                1= 654
                1= 655
```

```
                 1= 656          ;UNPACK BCD TO 1 DIGIT PER BYTE
                 1= 657          ;*****************************
                 1= 658
                 1= 659
01C5 BE03        1= 660          MOV    R6,#3        ;SET BYTE CTR
01C7 B93F        1= 661          MOV    R1,#BCD+1    ;PT TO FIXED ZERO
01C9 27          1= 662          CLR    A            ;& SET TO ZERO
01CA A1          1= 663          MOV    @R1,A
01CB C9          1= 664          DEC    R1           ;PT TO BCD LSD
01CC F1          1= 665 DISB:    MOV    A,@R1        ;GET 2 BCD DIGITS
01CD AF          1= 666          MOV    R7,A         ;& STORE
01CE 530F        1= 667          ANL    A,#0FH       ;MASK OUT HIGH DIGIT &
01D0 A1          1= 668          MOV    @R1,A        ;STORE LOW DIGIT
01D1 FF          1= 669          MOV    A,R7         ;RESTORE DIGITS
01D2 47          1= 670          SWAP   A
01D3 530F        1= 671          ANL    A,#0FH       ;MASK OUT LOW DIGIT
01D5 C9          1= 672          DEC    R1           ;& STORE HIGH DIGIT
01D6 A1          1= 673          MOV    @R1,A        ;IN NEXT BYTE OF REG
01D7 C9          1= 674          DEC    R1           ;PT TO NEXT PAIR BCD DIGITS
01D8 EECC        1= 675          DJNZ   R6,DISB      ;UNPACK 6 DIGITS A PAIR AT A TIME
                 = 676
                 = 677 $INCLUDE (:F1:RBLK.SR)
                 1= 678
                 1= 679
                 1= 680
                 1= 681          ;******************************************
                 1= 682          ;RIPPLE BLANK 4 MSD OF DISPAY
                 1= 683          ;DONE BY LOADING 0FH IN DISPLAY REG
                 1= 684          ;IN PLACE OF ZERO AS REQD
                 1= 685          ;R7 - DIGIT CTR
                 1= 686          ;R1 - PTS TO MSD
                 1= 687          ;******************************************
                 1= 688
                 1= 689
01DA BF04        1= 690 RBLK:    MOV    R7,#4        ;SET FOR 4 MSD
01DC B93A        1= 691          MOV    R1,#BCDHI    ;PT TO MSD
01DE F1          1= 692 DBLK:    MOV    A,@R1        ;LOAD DIGIT
01DF 96E7        1= 693          JNZ    SIGN         ;DIGIT NOT ZERO END BLANKING
01E1 230F        1= 694          MOV    A,#00FH      ;IF ZERO LOAD CODE FOR
01E3 A1          1= 695          MOV    @R1,A        ;BLANK INTO DISPLAY REG
01E4 19          1= 696          INC    R1           ;PT TO NEXT LSD
01E5 EFDE        1= 697          DJNZ   R7,DBLK      ;& DO ALL 4 DIGITS
                 1= 698
                 = 699
                 = 700 $INCLUDE (:F1:SIGN.SR)
                 1= 701
                 1= 702
                 1= 703          ;******************************************
                 1= 704          ;CHECKS R4 FOR REQD SIGN
                 1= 705          ;IF NEG FORCES MSD TO MINUS SIGN (-)
                 1= 706          ;EXCEPT AT ZERO
                 1= 707          ;IF REQD FORCES MSD TO 0.25 G IND
                 1= 708          ;******************************************
                 1= 709
                 1= 710
01E7 B93A        1= 711 SIGN:    MOV    R1,#BCDHI    ;PT TO MSD
01E9 FC          1= 712          MOV    A,R4         ;CHK SIGN REG
01EA C6F8        1= 713          JZ     SETDIS       ;IF NO SIGN SKIP
01EC BF0B        1= 714          MOV    R7,#00BH     ;LOAD 0.25 GRAD IND CODE IN STORE
01EE 32F6        1= 715          JB1    SQTRZ        ;IF REQD GO LOAD
01F0 BF0D        1= 716          MOV    R7,#00DH     ;IF NOT LOAD MINUS SIGN
01F2 F1          1= 717          MOV    A,@R1        ;CHK MSD IF NEGATIVE DIGIT
01F3 37          1= 718          CPL    A            ;COMP TO TEST THEN
01F4 7221        1= 719          JB3    FIRZ         ;IF IS GO ZERO (1ST CYCLE AFTER P\UP)
01F6 FF          1= 720 SQTRZ:   MOV    A,R7
```

```
01F7 A1        1= 721           MOV     @R1,A         ;LOAD IN MSD DISPLAY REG
                 = 722
01F8 74BE        = 723 SETDIS: CALL    DISP          ;O/P TO DISPLAY CONTROLLER
                 = 724
01FA B932        = 725           MOV     R1,#ABSR      ;PT TO ACCUM RESULT REG
01FC BF04        = 726           MOV     R7,#4
01FE 74AF        = 727           CALL    PCLR          ;CLR 4 BYTES
0200 540A        = 728           CALL    PBAL          ;CHK FOR BALANCE (A = 0)
0202 9608        = 729           JNZ     NPRT          ;IF NOT SKIP PRINT
0204 4608        = 730           JNT1    NPRT          ;CHK FOR PRINT REQ
0206 4432        = 731 GOP.     JMP     PREQ          ;IF SO GO PRINT
0208 0422        = 732 NPRT:   JMP     START         ;& GO START NEW ACCUMULATION
                 = 733 $EJECT
                   734 $INCLUDE (:F1:PBAL.SR)
                 = 735
                 = 736
                 = 737
                 = 738           ;*********************************************
                 = 739           ;CHECK READING WITHIN BALANCE TOL (3 OR 1 G)
                 = 740           ;SET BY DIP SW IF NOT IGNORE REQ
                 = 741           ;IF SO GO CHECK IF REQ VALID
                 = 742           ;*********************************************
                 = 743
0020             = 744           BALCHK  EQU     020H  ;BALANCE RESULT REG (2ND 1/2R - 1ST 1/2R)
                 = 745
020A B800        = 746 PBAL:   MOV     R3,#0         ;SET FOR OUT OF BAL
020C B819        = 747           MOV     R0,#FFILT     ;CHK IF IN FAST UPDATE MODE
020E F0          = 748           MOV     A,@R0         ;IF NOT GO CHK BAL
020F 9631        = 749           JNZ     NBAL          ;IF SO RET AS OUT BAL
                 = 750
0211 09          = 751           IN      A,P1          ;READ IN BAL TOL SWITCHES
0212 BEE5        = 752           MOV     R6,#0E5H      ;LOAD R6 FOR 3 GRAD
0214 D218        = 753           JB6     USPBAL        ;UNLESS OIML LIMITS SW SET
0216 BEFC        = 754           MOV     R6,#0FCH      ;THEN SET FOR 1/2 GRAD
0218 F21C        = 755 USPBAL: JB7     PBAL1         ;OR IF BAL SW NOT SET
021A BEF5        = 756           MOV     R6,#0F5H      ;FOR 1 GRAD BAL
                 = 757
021C B81F        = 758 PBAL1:  MOV     R0,#BALCHK-1  ;PT TO BAL RESULT HIGH BYTE
021E F0          = 759           MOV     A,@R0         ;TO CHK IF NEG RES
021F 18          = 760           INC     R0            ;THEN PT TO LOW BYTE
0220 C626        = 761           JZ      POSBAL        ;IF POS LEAVE
0222 B920        = 762           MOV     R1,#BALCHK    ;IF NEG TAKE COMP+1
0224 740C        = 763           CALL    COMP1
0226 B820        = 764 POSBAL. MOV     R0,#BALCHK
                 = 765
0228 F0          = 766           MOV     A,@R0
0229 6E          = 767           ADD     A,R6          ;CHK IF LOW BYTE IN BAL TOL
022A F631        = 768           JC      NBAL          ;IF NOT RET AS OUT OF BAL
022C C8          = 769           DEC     R0
022D F0          = 770           MOV     A,@R0         ;CHK IF HIGH BYTE ZERO
022E 9631        = 771           JNZ     NBAL          ;IF NOT RET AS OUT OF BAL
0230 27          = 772           CLR     A             ;SET TO RET AS IN BAL
0231 83          = 773 NBAL.   RET                   ;RET WITH R3 = 0 IF BAL,1 IF NOT
                 = 774 $EJECT
                   775 $INCLUDE (:F1:PRTREQ.SR)
                 = 776           ;*********************************************
                 = 777           ;CHECK O/P REG FOR 0 THRU 9,MINUS SIGN OR
                 = 778           ;BLANK CODES & LOAD CORRECT CODES FOR BLANK
                 = 779           ;OR MINUS PRINT IF REQD
                 = 780           ;CHECK PRINT SW PUSHED FOR 50 MS IF NOT
                 = 781           ;IGNORE REQUEST
                 = 782           ;IF SO DELAY FOR 1 SEC AFTER SW RELEASED
                 = 783           ;TO ENSURE TICKET FREE TO DRIVE
                 = 784           ;THEN ENABLE PRINT MOTOR DRIVE,ENSURE CAM
```

```
                = 785        ;HOME AND GO DO PRINT
                = 786        ;*****************************************
                = 787
00FA            = 788        ENPRIN  EQU     0FAH        ;ENABLE PRINT MOTOR
                = 789
                = 790        ;*****************************************
                = 791        ;CHK & SET FOR BLANK OR MINUS PRINT
                = 792        ;*****************************************
                = 793
0232 B93A       = 794 PREQ:  MOV     R1,#BCDHI   ;PT TO MSD OF DISPLAY REG
0234 BF06       = 795        MOV     R7,#6       ;SET FOR 6 DIGITS
0236 F1         = 796 PND:   MOV     A,@R1
0237 AB         = 797        MOV     R3,A        ;SAVE VALUE
0238 03F5       = 798        ADD     A,#0F5H     ;CHK IF 0 THRU 9
023A E644       = 799        JNC     NUM         ;IF SO LEAVE ALONE
023C FB         = 800        MOV     A,R3        ;IF NOT RESTORE VALUE
023D BE0B       = 801        MOV     R6,#00BH    ;THEN LOAD FOR BLANK PRINT
023F 3242       = 802        JB1     PRTB        ;IF IS BLANK DONT CHANGE
0241 CE         = 803        DEC     R6          ;IF MINUS DEC FOR MINUS PRINT (0A)
0242 FE         = 804 PRTB:  MOV     A,R6        ;LOAD APPROPRIATE CODE IN
0243 A1         = 805        MOV     @R1,A
0244 19         = 806 NUM:   INC     R1          ;DISPLAY REG
0245 EF36       = 807        DJNZ    R7,PND      ;FOR ALL DIGITS
                = 808
                = 809
                = 810        ;*****************************************
                = 811        ;CHK IF VALID PRINT REQ
                = 812        ;*****************************************
                = 813
                = 814
0247 BE1E       = 815 NNORB: MOV     R6,#30      ;SET FOR DELAY ON RELEASE OF PRINT SWT
0249 BD00       = 816        MOV     R5,#0       ;SET DLY LOOP FOR 33 MS
024B 74B5       = 817        CALL    DLY         ;WAIT FOR 33 MS IF NOT STILL
024D 467C       = 818        JNT1    PEND        ;PUSHED IGNORE REQ
024F 74B5       = 819 INSERT:CALL    DLY         ;IF IS CHK EVERY 33 MS FOR
0251 564F       = 820        JT1     INSERT      ;RELEASE OF SW
0253 EE4F       = 821        DJNZ    R6,INSERT   ;TIME = R6 (33MS)
0255 23FA       = 822        MOV     A,#ENPRIN   ;ENABLE PRINT MOTOR
0257 39         = 823        OUTL    P1,A
0258 2662       = 824        JNT0    PRINT       ;IF CAM HOME DO NOT MOVE
025A BC00       = 825 SYNC:  MOV     R4,#FIRST   ;IF NOT ADVANCE MOTOR
025C BF04       = 826        MOV     R7,#4       ;4 STEPS AT A TIME
025E 54B9       = 827        CALL    MOTOR       ;UNTIL IT IS
0260 365A       = 828        JT0     SYNC
                = 829 $EJECT
                  830 $INCLUDE (:F1:PEBPRT.SR)
                = 831
                = 832
                = 833
                = 834        ;*****************************************
                = 835        ;PRINTS SEQUENTIALLY THE DATA IN THE
                = 836        ;DISPLAY REG MSD FIRST THEN LINE FEEDS
                = 837        ;THE TICKET OUT
                = 838        ;*****************************************
                = 839
                = 840
                = 841
0000            = 842        FIRST   EQU     0           ;FIRST STEP OF STEPPER
0200            = 843        CHART   EQU     200H
                = 844
                = 845
0262 B91E       = 846 PRINT: MOV     R1,#01EH    ;SET ROW CTR TO 30
0264 B83A       = 847        MOV     R0,#BCD-4   ;PT TO NT DIGIT
0266 BC00       = 848        MOV     R4,#FIRST   ;LOAD FIRST STEPPER DRIVE SEQUENCE
```

```
0268 2308    = 849 PAC:    MOV     A,#LOW CHART    ;PT TO CHAR TABLE
026A 60      = 850         ADD     A,@R0           ;PT TO CHAR
026B AA      = 851         MOV     R2,A            ;& STORE IN R2
026C 547E    = 852         CALL    PCHAR           ;PRINT CHAR & INC ROW CTR
026E BF18    = 853         MOV     R7,#018H        ;24 STEPS TO
0270 5489    = 854         CALL    MOTOR           ;SPACE 1 ROW
0272 18      = 855         INC     R0              ;PT TO NEXT CHAR
0273 E968    = 856         DJNZ    R1,PAC          ;IF NOT 6 CHARS GO AGAIN
0275 BFF0    = 857         MOV     R7,#0F0H        ;THEN ADVANCE 2 CHAR SPACES
0277 5489    = 858         CALL    MOTOR           ;TO EJECT TICKET
0279 23FB    = 859         MOV     A,#0UIES        ;DISABLE PRINT MOTOR
027B 39      = 860         OUTL    P1,A
027C 4408    = 861 PEND:   JMP     NPRT            ;PRINT COMPLETE
             = 862 $EJECT
             = 863         ;SUBROUTINES
             = 864
             = 865
             = 866
             = 867
027E BE04    = 868 PCHAR:  MOV     R6,#004H        ;SET DIGIT ROW CTR
0280 A5      = 869         CLR     F1
0281 B5      = 870 NROW:   CPL     F1              ;SET EVEN ROW FLAG
0282 BF04    = 871         MOV     R7,#004H
0284 5489    = 872         CALL    MOTOR           ;ADV 4 STEPS IN ROW
0286 97      = 873         CLR     C
0287 BB08    = 874         MOV     R3,#008H        ;SET ROW DOT CTR
0289 F9      = 875         MOV     A,R1            ;CHK ROW CTR, IF EVEN
028A 128D    = 876         JB0     FLG             ;(30,28,26,ETC) DO RIGHT
028C A5      = 877         CLR     F1              ;SHIFT ROUTINE, IF ODD
028D FA      = 878 FLG:    MOV     A,R2            ;DO LEFT SHIFT ROUTINE
028E A3      = 879         MOVP    A,@A            ;LOAD 1ST ROW DOTS
028F 7692    = 880         JF1     MDOT            ;IF NO FLAG
0291 E7      = 881         RL      A               ;SET FOR 0 (SPACE) ON RIGHT
0292 7696    = 882 MDOT:   JF1     ELR
0294 67      = 883         RRC     A               ;IF FLAG NOT SET SHIFT OUT TO
0295 67      = 884         RRC     A               ;CARRY FROM RIGHT
0296 F7      = 885 ELR:    RLC     A               ;IF IS SET SHIFT OUT FROM LEFT
0297 D5      = 886         SEL     RB1
0298 A8      = 887         MOV     R0,A            ;STORE ROW POSN
0299 C5      = 888         SEL     RB0
029A E6A3    = 889         JNC     NODOT           ;SKIP IF NO DOT REQD
029C 2380    = 890         MOV     A,#080H         ;IF IS O/P
029E 3A      = 891         OUTL    P2,A            ;'1' ON P27
029F BDE9    = 892         MOV     R5,#-23         ;FOR 3 MS PRINT TIME
02A1 74B5    = 893         CALL    DLY
02A3 BF02    = 894 NODOT:  MOV     R7,#002H        ;2 DOT POSN ADVANCES
02A5 5489    = 895         CALL    MOTOR
02A7 D5      = 896         SEL     RB1
02A8 F8      = 897         MOV     A,R0            ;RESTORE ROW DATA TO ACCUM
02A9 C5      = 898         SEL     RB0
02AA EB92    = 899         DJNZ    R3,MDOT         ;REPEAT TILL ROW DONE
02AC BF04    = 900         MOV     R7,#004H        ;ADV 4 STEPS TO FINISH ROW
02AE 5489    = 901         CALL    MOTOR
02B0 230C    = 902         MOV     A,#LOW (ROW2 - ROW1)    ;LOAD CHAR TABLE DISPLACEMENT
02B2 6A      = 903         ADD     A,R2            ;GET NEXT CHAR ROW ADDRESS
02B3 AA      = 904         MOV     R2,A            ;STORE ADDRESS IN R2 TEMP
02B4 C9      = 905         DEC     R1              ;DEC ROW CTR
02B5 EE81    = 906         DJNZ    R6,NROW         ;REPEAT TILL CHAR DONE
02B7 A5      = 907         CLR     F1              ;CLR POWUP FLAG
02B8 83      = 908         RET
             = 909 $EJECT
             = 910
             = 911
             = 912
```

```
0289 23CA    = 914 MOTOR:  MOV    A,#LOW TABM     ;LOAD STEPPER LOOK-UP TABLE
028B 6C      = 915         ADD    A,R4            ;ADDRESS STEP SEQUENCE
028C A3      = 916         MOVP   A,@A            ;GET STEPPER DRIVE DATA
028D 3A      = 917         OUTL   P2,A            ;& O/P
028E FC      = 918         MOV    A,R4            ;LOAD CURRENT STEP SEQUENCE
028F 17      = 919         INC    A               ;AND INCREMENT TO NEXT
02C0 5303    = 920         ANL    A,#3            ;RESET STEP SEQUENCE FROM 3 TO 0
02C2 AC      = 921         MOV    R4,A            ;SET REGISTER FOR NEXT STEP SEQUENCE
02C3 BDCB    = 922         MOV    R5,#-53         ;ALLOW 7 MS FOR STEP
02C5 7485    = 923         CALL   DLY
02C7 EFB9    = 924         DJNZ   R7,MOTOR        ;REPEAT AS REQD BY R7
02C9 83      = 925         RET
             = 926 $EJECT
             = 927         ;STEPPER DRIVE LOOK-UP TABLE
             = 928
02CA 0A      = 929 TABM:   DB     0AH
02CB 09      = 930         DB     09H
02CC 05      = 931         DB     05H
02CD 06      = 932         DB     06H
             = 933
             = 934         ;CHARACTER TABLE
02D0         = 935         ORG    CHART
02D0 3E      = 936 ROW1:   DB     3EH
02D1 00      = 937         DB     00H
02D2 27      = 938         DB     27H
02D3 22      = 939         DB     22H
02D4 7C      = 940         DB     7CH
02D5 7A      = 941         DB     7AH
02D6 1E      = 942         DB     1EH
02D7 47      = 943         DB     47H
02D8 36      = 944         DB     36H
02D9 30      = 945         DB     30H
02DA 08      = 946         DB     08H
02DB 00      = 947         DB     0
             = 948
02DC 41      = 949 ROW2:   DB     41H
02DD 21      = 950         DB     21H
02DE 49      = 951         DB     49H
02DF 49      = 952         DB     49H
02E0 04      = 953         DB     04H
02E1 49      = 954         DB     49H
02E2 29      = 955         DB     29H
02E3 48      = 956         DB     48H
02E4 49      = 957         DB     49H
02E5 49      = 958         DB     49H
02E6 08      = 959         DB     08H
02E7 00      = 960         DB     0
             = 961
02E8 41      = 962 ROW3:   DB     41H
02E9 7F      = 963         DB     7FH
02EA 49      = 964         DB     49H
02EB 49      = 965         DB     49H
02EC 1F      = 966         DB     1FH
02ED 49      = 967         DB     49H
02EE 49      = 968         DB     49H
02EF 50      = 969         DB     50H
02F0 49      = 970         DB     49H
02F1 4A      = 971         DB     4AH
02F2 08      = 972         DB     08H
02F3 00      = 973         DB     0
             = 974
02F4 3E      = 975 ROW4:   DB     3EH
02F5 01      = 976         DB     01H
```

```
02F6 31      =  977          DB      31H
02F7 36      =  978          DB      36H
02F8 04      =  979          DB      04H
02F9 46      =  980          DB      46H
02FA 06      =  981          DB      06H
02FB 60      =  982          DB      60H
02FC 36      =  983          DB      36H
02FD 3C      =  984          DB      3CH
02FE 08      =  985          DB      08H
02FF 00      =  986          DB      0
             =  987 $EJECT
                988
0300            989          ORG     300H
                990 $INCLUDE (:F1:ZLIMIT.SR)
             =  991          ;ENABLE READ OF ZERO RANGE SW
             =  992
             =  993
             =  994          ;****************************************************
             =  995          ;PREVENTS AZT OR PB ZERO IF OUT OF ZERO RANGE LIMIT
             =  996          ;OIML & CANADA 2% LIMITS SELECTED BY ZERO RANGE
             =  997          ;LIMIT SWITCH (20,40,60,80,100,120 OR 140 GRADS +/-)
             =  998          ;FOR USA RANGE LIMITED TO 4 DIGITS FOR NEG DISPLAY
             =  999          ;BY 1 - 9400 GRADS MAX
             = 1000          ;BY 2 - 4800 GRADS MAX
             = 1001          ;BY 5 - 1800 GRADS MAX
             = 1002          ;****************************************************
             = 1003
             = 1004
00DB         = 1005          ZEROB   EQU     0DBH    ;ENABLE READ OF ZERO RANGE SW
             = 1006
             = 1007
             = 1008          ;****************************************************
             = 1009          ;DEVIDE ACCUM RES BY 16 TO SIMPLIFY USA LIMIT CHK
             = 1010          ;AND GET OIML & CANADA LIMIT CHK WITHIN LOW BYTE
             = 1011          ;****************************************************
             = 1012
0300 B93E    = 1013 ZLIMIT:  MOV     R1,#BCD         ;TEMP RES REG
0302 B832    = 1014          MOV     R0,#ABSR        ;PT TO ACCUM RES
0304 74EA    = 1015          CALL    DMOV            ;& LOAD
0306 BB3B    = 1016          MOV     R3,#BCD-3       ;PT TO HI BYTE
0308 BA04    = 1017          MOV     R2,#4           ;SET FOR 4 LOOPS
030A 3408    = 1018          CALL    DVIDE           ;DEVIDE ACCUM RES BY 16
             = 1019
             = 1020          ;****************************************************
             = 1021          ;IF ZERO RANGE SELECT SW HI GO CHK USA LIMITS
             = 1022          ;IF NOT CALC 2% ZERO LIMIT VALUE AND STORE IN R6
             = 1023          ;****************************************************
             = 1024
030C 89FB    = 1025          ORL     P1,#QUIES       ;SET O/P LATCHES HI
030E 09      = 1026          IN      A,P1            ;CHK IF ZERO RANGE SW SET USA LIMITS
030F D237    = 1027          JB6     USLIM           ;IF SO GO USA
0311 23DB    = 1028          MOV     A,#ZEROB        ;PT TO SWITCHES
0313 39      = 1029          OUTL    P1,A
0314 08      = 1030          INS     A,BUS           ;& READ IN (ON BITS 4,5,6)
0315 47      = 1031          SWAP    A               ;SWAP TO MAKE BCD #
0316 5307    = 1032          ANL     A,#7            ;MASK OUT HIGH BITS
0318 17      = 1033          INC     A               ;ADJUST FOR 1 THRU 8 RANGE
0319 AF      = 1034          MOV     R7,A            ;IF NOT SET LOOP CTR
031A 27      = 1035          CLR     A
031B 030A    = 1036 ZLIM:    ADD     A,#10           ;ADD 10 FOR EA RANGE
031D EF1B    = 1037          DJNZ    R7,ZLIM         ;SET ON SW
031F AE      = 1038          MOV     R6,A            ;STORE VALUE LIMIT IN R6
             = 1039
```

```
              =1040      ;*********************************************
              =1041      ;CHK IF IN 2% OIML OR CANADA LIMIT BAND
              =1042      ;TEST HI BYTE FOR ZERO
              =1043      ;SUBTRACT 125 (DEAD LOAD VALUE) FROM LOW BYTE
              =1044      ;THEN ADD COMP OF RESULT TO APPROP. LIMIT TO CHK
              =1045      ;*********************************************
              =1046
0320 B93C     =1047           MOV    R1,#BCD-2
0322 F1       =1048           MOV    A,@R1          ;CHK HI BYTE
0323 9651     =1049           JNZ    NOZERO         ;IF NOT ZERO GO PREVENT REZERO
0325 19       =1050           INC    R1             ;IF IS
0326 A7       =1051           CPL    C              ;SET CARRY
0327 42       =1052           MOV    A,T            ;GET SPANF
0328 C62B     =1053           JZ     SPNZRO         ;SPANF=0? YES, JMP
032A 97       =1054           CLR    C
032B 67       =1055 SPNZRO:   RRC    A
032C 37       =1056           CPL    A              ;CALCULATE DEAD LOAD EFFECT
032D 61       =1057           ADD    A,@R1          ;SUBTRACT DEADLOAD FROM WT
032E E631     =1058           JNC    ZNEG           ;IF RESULT NEG LEAVE AS COMP
0330 37       =1059           CPL    A              ;IF POS COMP
0331 6E       =1060 ZNEG:     ADD    A,R6           ;ADD ZERO LIMIT
0332 E651     =1061           JNC    NOZERO         ;IF OUTSIDE LIMIT PREVENT REZERO
0334 27       =1062           CLR    A
0335 6457     =1063           JMP    INLIM          ;IF OK SET TO ENABLE ZERO
              =1064
              =1065      ;*********************************************
              =1066      ;FOR USA LIMIT ZERO TO LESS THAN 4 DIGITS (- SIGN MSD)
              =1067      ;ACTUAL LIMITS :      BY 1 - 8900 GRADS
              =1068      ;                     BY 2 - 4800 GRADS
              =1069      ;                     BY 5 - 1800 GRADS
              =1070      ;*********************************************
              =1071
0337 B93C     =1072 USLIM:    MOV    R1,#BCD-2      ;PT TO HI BYTE
0339 B821     =1073           MOV    R0,#RDFACT     ;PT TO ROUNDING FACTOR
033B F0       =1074           MOV    A,@R0          ;LOAD FACTOR
033C 67       =1075           RRC    A              ;THEN SHIFT RIGHT &
033D 17       =1076           INC    A              ;ADD 1 (BY 1=1,BY 2=2,BY 5=3)
033E 5303     =1077           ANL    A,#03H
0340 AF       =1078           MOV    R7,A           ;& LOAD VALUE IN LOOP CTR
0341 23E0     =1079           MOV    A,#0E0H        ;SET TWICE BY 1 LIMIT TO ALLOW
0343 97       =1080 SETLIM:   CLR    C              ;FOR FIRST SHIFT
0344 A7       =1081           CPL    C              ;SET CARRY TO SHIFT 1'S IN LEFT
0345 67       =1082           RRC    A              ;SHIFT TO CORRECT LIMIT AS
0346 EF43     =1083           DJNZ   R7,SETLIM      ;SET BY R7 LOOP CTR
0348 524B     =1084           JB2    LIM5           ;IF NOT BY 5 LIMIT LEAVE
034A 07       =1085           DEC    A              ;IF IS ADD 256 TO LIMIT TO INCREASE RANGE
034B 61       =1086 LIM5:     ADD    A,@R1          ;ADD HI BYTE TO CHK IF IN LIMIT
034C F651     =1087           JC     NOZERO         ;IF NOT GOO PREVENT ZERO
034E 27       =1088           CLR    A              ;IF SO SET TO ENABLE ZERO
034F 6457     =1089           JMP    INLIM
              =1090
              =1091      ;*********************************************
              =1092      ;RESET AZT BAND CTR TO PREVENT OUT LIMIT TRACKING
              =1093      ;SET A TO "1" TO ACT AS ZERO INHIBIT FLAG
              =1094      ;*********************************************
              =1095
0351 B82D     =1096 NOZERO:   MOV    R0,#CAZTC      ;PT TO AZTB CTR
0353 B000     =1097           MOV    @R0,#0         ;& RESET
0355 2303     =1098           MOV    A,#3           ;SET A AS FLAG
0357 83       =1099 INLIM:    RET
              =1100 $EJECT
              1101 $INCLUDE (:F1:SUBT.SR)
```

```
                =1102          ;****************************************
                =1103          ;SUBTRACTS PREV READING FROM
                =1104          ;CURRENT READING LEAVING BALANCE
                =1105          ;RESULT IN BALCHK REG
                =1106          ;****************************************
                =1107
                =1108
0358 B820       =1109 SUBT:    MOV    R0,#BALCHK      ;TAKE COMP+1 OF PREVIOUS RESULT
035A B91C       =1110          MOV    R1,#PREV-1
035C 74DC       =1111          CALL   COMP1
                =1112
035E FA         =1113          MOV    A,R2            ;LOAD PTR
035F A8         =1114          MOV    R0,A            ;IN R0 THEN SUBTRACT PREV READING
0360 B920       =1115          MOV    R1,#BALCHK      ;FROM CURRENT READING
0362 BF03       =1116          MOV    R7,#3           ;TO GIVE BAL TOL
0364 74A6       =1117          CALL   BADD
0366 83         =1118          RET
                =1119 $EJECT
                1120 $INCLUDE (:F1:FORD.SR)
                =1121          ;****************************************
                =1122          ;CAUSES BARS TO BE DISPLAYED FOR
                =1123          ;OVER CAPACITY
                =1124          ;AND 8'S OR BLANKS FOR DISPLAY TEST
                =1125          ;****************************************
                =1126
                =1127
0367 FB         =1128 FORD:    MOV    A,R3            ;LOAD CODE FOR BARS (-----) OR DISPLAY TEST
0368 BF06       =1129          MOV    R7,#6           ;SET FOR 6 DIGITS
036A B93F       =1130          MOV    R1,#BCD+1       ;PT TO FIXED ZERO
036C A1         =1131 DMOD:    MOV    @R1,A           ;SET DISP REG FOR BARS,8'S OR BLANKS
036D C9         =1132          DEC    R1              ;PT TO NEXT MSD
036E EF6C       =1133          DJNZ   R7,DMOD         ;& DO ALL DIGITS
0370 74BE       =1134          CALL   DISP            ;GO SET DISPLAY TO BARS,8'S OR BLANKS
0372 83         =1135          RET
                =1136 $EJECT
                1137 $INCLUDE (:F1:PBMULT.SR)
                =1138
                =1139                                  .
                =1140          ;*********************************************************
                =1141          ;BINARY MULTIPLY 24 BIT BY 8 BIT NUMBERS RESULT = 32BITS
                =1142          ;ON ENTRY FOLLOOWING REQUIRED :
                =1143          ;R0 - POINT TO MULTIPLIER REGISTER
                =1144          ;R2 - POINT TO RESULT REGISTER LOW BYTE
                =1145          ;R3 - POINT TO MULTIPLICAND REG LOW BYTE
                =1146
                =1147          ;USES RIGHT SHIFT OF MULTIPLIER & TEST TO CHECK IF ADD
                =1148          ;REQUIRED BEFORE EACH LEFT SHIFT OF MULTIPLICAND
                =1149          ;*********************************************************
                =1150
                =1151          ;R5 - SPAN FACTOR STORE
                =1152          ;R0(RB1) - TEMP STORE OF MULTIPLIER
                =1153          ;R6 - MULTIPLIER BIT CTR
                =1154          ;R7 - BYTE CTR
                =1155
                =1156
0373 F0         =1157 PBMULT:  MOV    A,@R0           ;LOAD SPAN FACTOR (MULTIPLIER)
0374 D5         =1158          SEL    RB1
0375 A8         =1159          MOV    R0,A            ;IN TEMP STORE REG
0376 C5         =1160          SEL    RB0
0377 AD         =1161          MOV    R5,A            ;STORE S.F. FOR LATER ZERO CHK
0378 BE08       =1162          MOV    R6,#8           ;SET FOR 8 BIT MULTIPLIER
037A FA         =1163          MOV    A,R2
037B A9         =1164          MOV    R1,A            ;PT TO RESULT REG LOW BYTE
037C A5         =1165          CLR    F1              ;CLEAR FLAG 1 FOR ZERO S.F. TEST
```

```
037D BF03   =1166        MOV   R7,#3           ;SET BYTE CTR
037F 74AF   =1167        CALL  PCLR            ;CLEAR RESULT REG
0381 D5     =1168 MULT1: SEL   RB1
0382 F8     =1169        MOV   A,R0            ;LOAD MULTIPLIER
0383 97     =1170        CLR   C               ;CLR CARRY
0384 67     =1171        RRC   A               ;ROTATE RIGHT & CHK LOW BIT
0385 A8     =1172        MOV   R0,A            ;STORE NEW MULTIPLIER VALUE
0386 C5     =1173        SEL   RB0
0387 E693   =1174        JNC   NADD            ;IF NO CARRY DO NOT ADD
0389 FB     =1175 ZSPANF:MOV   A,R3
038A A8     =1176        MOV   R0,A            ;IF CARRY PT TO MULTIPLICAND
038B FA     =1177        MOV   A,R2
038C A9     =1178        MOV   R1,A            ;& RESULT REG LOW BYTES
038D BF03   =1179        MOV   R7,#3           ;SET BYTE CTR FOR 3 BYTES
038F 74A6   =1180        CALL  BADD            ;ADD & STORE AS NEW RESULT
0391 76A4   =1181        JF1   SFEND           ;ZERO S. F. RESULT COMP SO END
0393 FB     =1182 NADD:  MOV   A,R3
0394 A8     =1183        MOV   R0,A            ;PT BACK TO MULTIPLICAND LOW BYTE
0395 BF03   =1184        MOV   R7,#3           ;SET BYTE CTR FOR 3 BYTES
0397 97     =1185        CLR   C               ;CLR CARRY
0398 F0     =1186 LSFT:  MOV   A,@R0           ;GET BYTE &
0399 F7     =1187        RLC   A               ;SHIFT LEFT INTO CARRY
039A A0     =1188        MOV   @R0,A           ;PUT BACK AS NEW MULTIPLICAND
039B C8     =1189        DEC   R0              ;PT TO NEXT BYTE
039C EF98   =1190        DJNZ  R7,LSFT         ;REPEAT FOR 4 BYTES
039E EE81   =1191        DJNZ  R6,MULT1        ;REPEAT FOR 8 BITS OF MULTIPLIER
03A0 B5     =1192        CPL   F1              ;SET F1
03A1 FD     =1193        MOV   A,R5            ;RESTORE SPAN FACTOR
03A2 C689   =1194        JZ    ZSPANF          ;IF 0 GO SET RESULT IN 2 HIGH BYTES
03A4 A5     =1195 SFEND: CLR   F1              ;CLR POWUP FLAG
03A5 83     =1196        RET
            =1197 $EJECT
            1198 $INCLUDE (:F1:BADD.SR)
            =1199
            =1200        ;***********************************************************
            =1201        ;BINARY ADD OF EQUAL BYTE NUMBERS (IF N1=3 BYTES THEN
            =1202        ;N2 MUST =3 BYTES FOR CORRECT ADDITION OF N1 + N2)
            =1203        ;ON ENTRY FOLLOWING MUST BE SET:
            =1204        ;R7 - NUMBER OF BYTES IN EACH NUMBER (N1&N2)
            =1205        ;R0 - PTR TO LOW BYTE OF # TO BE ADDED
            =1206        ;R1 - PTR TO LOW BYTE OF RESULT REG
            =1207
            =1208        ;ADDS TO A PREVIOUS RESULT GIVING NEW VALUE IN RESULT REG
            =1209        ;***********************************************************
            =1210
            =1211
03A6 97     =1212 BADD:  CLR   C               ;CLEAR CARRY
03A7 F1     =1213 BAD1:  MOV   A,@R1           ;GET PARTIAL RESULT
03A8 70     =1214        ADDC  A,@R0           ;ADD MULTIPLICAND
03A9 A1     =1215        MOV   @R1,A           ;STORE BACK AS NEW PARTIAL RESULT
03AA C8     =1216        DEC   R0
03AB C9     =1217        DEC   R1              ;DEC POINTERS
03AC EFA7   =1218        DJNZ  R7,BAD1         ;REPEAT UNTILL ALL BYTES ADDED
03AE 83     =1219        RET
            =1220 $EJECT
            1221 $INCLUDE (:F1:PCLR.SR)
            =1222
            =1223        ;***********************************************************
            =1224        ;CLEARS ANY LENGTH REGISTER IN RAM ON ENTRY FOLLOWING
            =1225        ;REQUIRED:
            =1226        ;R7 - SET TO NUMBER OF BYTES TO BE RESET
            =1227        ;R1 - POINTED TO LOW BYTE ADDRESS
            =1228        ;***********************************************************
            =1229
```

```
                  =1230
03AF B100         =1231 PCLR:    MOV     @R1,#0          ;LOAD ZERO
03B1 C9           =1232          DEC     R1              ;PT TO NEXT BYTE
03B2 EFAF         =1233          DJNZ    R7,PCLR         ;& REPEAT UNTILL ALL DONE
03B4 83           =1234          RET
                  =1235 $EJECT
                  1236 $INCLUDE (:F1:PTIMER.SR)
                  =1237          ;********************************
                  =1238          ;TIME DELAY OF 130 MICROSEC
                  =1239          ;FOR EACH CYCLE OF TIMER CTR
                  =1240          ;ENTER WITH DELAY CONST. IN ACCUM
                  =1241          ;********************************
                  =1242
                  =1243
03B5 FD           =1244 DLY:     MOV     A,R5            ;FOR PRINT DELAYS LOAD FROM R5
03B6 62           =1245 TIMER:   MOV     T,A             ;LOAD TIMER DLY
03B7 55           =1246          STRT    T               ;& LOOP THAT MANY TIMES
03B8 16BC         =1247 TIMER1:  JTF     TIMER2          ;DLY=N(130) MICROSEC
03BA 64B8         =1248          JMP     TIMER1
03BC 65           =1249 TIMER2:  STOP    TCNT
03BD 83           =1250          RET
                  =1251 $EJECT
                  1252 $INCLUDE (:F1:PDISP.SR)
                  =1253
                  =1254
                  =1255          ;********************************
                  =1256          ;OUTPUT TO DISPLAY CONTROLLER
                  =1257          ;TAKES BCD FROM DISPLAY REG ONE
                  =1258          ;DIGIT AT A TIME.OR'S IN EACH
                  =1259          ;DIGIT ADDRESS,O/P'S DATA & ADDRESS
                  =1260          ;THEN GENERATES A WRITE ENABLE
                  =1261          ;R0 - PTS TO DISPLAY REG LOW BYTE
                  =1262          ;R6 - USED AS ADDRESS CTR
                  =1263          ;R7 - USED AS BYTE CTR
                  =1264          ;********************************
                  =1265
                  =1266
00F9              =1267          NWE     EQU     0F9H    ;WRITE ENABLE TO DISPLAY CONTROLLER
                  =1268
                  =1269
03BE B83F         =1270 DISP:    MOV     R0,#BCD+1       ;PT TO DISPLAY REG LOW BYTE
03C0 23EB         =1271          MOV     A,#SPARD
03C2 39           =1272          OUTL    P1,A            ;ENABLE ZERO IN / OUT SWITCH
03C3 08           =1273          INS     A,BUS
03C4 F2C9         =1274          JB7     FZ              ;IF SET LEAVE ZERO IN
03C6 230F         =1275          MOV     A,#0FH          ;IF NOT BLANK OUT
03C8 A0           =1276          MOV     @R0,A
03C9 BF06         =1277 FZ:      MOV     R7,#6           ;SET FOR 6 DIGITS
03CB BE00         =1278          MOV     R6,#0           ;SET DISPLAY ADDRESS CTR TO ZERO
03CD FE           =1279 DISP1:   MOV     A,R6            ;LOAD DIGIT ADDRESS
03CE 47           =1280          SWAP    A               ;INTO HIGH BITS
03CF 40           =1281          ORL     A,@R0           ;'OR' DIGIT INTO LOW BITS
03D0 3A           =1282          OUTL    P2,A            ;O/P DIGIT & ADDRESS TO DISPLAY CONTR.
03D1 1E           =1283          INC     R6              ;INC CTR TO NEXT DIGIT ADDRESS
03D2 23F9         =1284          MOV     A,#NWE          ;O/P WRITE ENABLE TO DISPLAY CONTR.
03D4 39           =1285          OUTL    P1,A
03D5 C8           =1286          DEC     R0              ;PT TO NEXT DIGIT
03D6 23FB         =1287          MOV     A,#QUIES        ;REMOVE WRITE ENABLE
03D8 39           =1288          OUTL    P1,A
03D9 EFCD         =1289          DJNZ    R7,DISP1        ;O/P ALL 6 DIGITS
03DB 83           =1290          RET
                  =1291 $EJECT
                  1292 $INCLUDE (:F1:COMP1.SR)
                  =1293
```

```
                =1294
                =1295          ;*********************************************
                =1296          ;CONVERT A # TO ITS COMPLEMENT+1
                =1297          ;USED FOR STORED ZERO REF
                =1298          ;& TO CORRECT NEGATIVE NUMBERS
                =1299          ;R0 - PTS TO COMP+1 RES REG
                =1300          ;R1 - PTS TO # TO BE CONVERTED
                =1301          ;R7 - BYTE CTR
                =1302          ;*********************************************
                =1303
                =1304
                =1305
                =1306
03DC BF03       =1307 COMP1:   MOV     R7,#3           ;SET BYTE CTR TO 3
03DE 97         =1308          CLR     C               ;CLR CARRY THEN
03DF A7         =1309          CPL     C               ;SET TO ADD 1
03E0 F1         =1310 ZCOMP:   MOV     A,@R1           ;LOAD RESULT BYTE
03E1 37         =1311          CPL     A               ;COMPLEMENT
03E2 1300       =1312          ADDC    A,#0            ;ADD IN CARRY FOR +1
03E4 A0         =1313          MOV     @R0,A           ;STORE BYTE OF NEW ZERO REF
03E5 C8         =1314          DEC     R0              ;PT TO NEXT BYTES
03E6 C9         =1315          DEC     R1
03E7 EFE0       =1316          DJNZ    R7,ZCOMP        ;UPDATE ALL 3 BYTES
03E9 83         =1317          RET
                =1318 $EJECT
                 1319 $INCLUDE (:F1.DMOV.SR)
                =1320
                =1321
                =1322          ;*********************************************
                =1323          ;MOVES CONTENTS OF REG PTD BY R0
                =1324          ;INTO REG PTD BY R1
                =1325          ;R7 SETS NUMBER OF BYTES
                =1326          ;*********************************************
                =1327
                =1328
                =1329
03EA BF04       =1330 DMOV:    MOV     R7,#4           ;SET FOR 4 BYTES
03EC F0         =1331 DMOV1:   MOV     A,@R0
03ED A1         =1332          MOV     @R1,A           ;LOAD REG PTD BY R0 INTO ONE
03EE C9         =1333          DEC     R1              ;PTD BY R1
03EF C8         =1334          DEC     R0
03F0 EFEC       =1335          DJNZ    R7,DMOV1        ;DO ALL BYTES
03F2 83         =1336          RET
                =1337 $EJECT
03F6             1338          ORG     3F6H
                 1339 $INCLUDE (:F1.PEBTAB.SR)
                =1340
                =1341
                =1342          ;*********************************************
                =1343          ;BINARY CONVERSION FACTOR LOOK UP TABLE
                =1344          ;*********************************************
                =1345
                =1346
03F6 0001       =1347 BINTAB   DW      1
03F8 000A       =1348          DW      10
03FA 0064       =1349          DW      100
03FC 03E8       =1350          DW      1000
03FE 2710       =1351          DW      10000
                 1352 END

USER SYMBOLS
ABSR   0032   ABYTE  0100   AGIN   005E   ANC    0001   AZTB   0140   BAD1   03A7   BADD   03A6   BALCHK 0028
BCD    003E   BCDHI  003A   BCDLD  0041   BCDLO  003E   BIN1   01AC   BIN2   01B3   BIN3   01B8   BIN4   0026
BINARY 0038   BINBCD 0190   BINTAB 03F6   BINZ   0035   BY2    01A1   CAZTC  002D   CHART  02D0   COMP1  03DC
```

| | | | | | | | | | | | |
|---|---|---|---|---|---|---|---|---|---|---|---|
| CONVA | 0009 | CYCTR | 0022 | DBLK | 01DE | DCON | 000B | DCONV | 0069 | DIG0 | 0073 | DIG5 | 0038 | DISB | 01CC |
| DISP | 03BE | DISP1 | 03CD | DLY | 03B5 | DMOD | 036C | DMOV | 03EA | DMOV1 | 03EC | DVIDE | 0108 | ERZTB | 00EB |
| ELR | 0296 | END5 | 0034 | ENPRIN | 00FA | FABS | 0003 | FDLYS | 0007 | FFILT | 0019 | FIRST | 0000 | FIRZ | 0121 |
| FLG | 028D | FORD | 0367 | FZ | 03C9 | GOP | 0206 | GORE | 00C5 | INLIM | 0357 | INSERT | 024F | LIM5 | 0348 |
| LOV | 0107 | LSFT | 0398 | MDOT | 0292 | MOTOR | 02B9 | MULT1 | 0381 | N | 0010 | NADD | 0393 | NAZ | 0179 |
| NBAL | 0231 | NNORB | 0247 | NODOT | 02A3 | NOZERO | 0351 | NOZO | 0168 | NPRT | 0208 | NROW | 0281 | NUM | 0244 |
| NWE | 00F9 | NZUD | 0127 | OVERLD | 00F8 | PAC | 0268 | PBAL | 020A | PBAL1 | 021C | PBMULT | 0373 | PCALC | 0116 |
| PCHAR | 027E | PCLR | 03AF | PEBCON | 0050 | PEND | 027C | PND | 0236 | POL | 0135 | PONZ | 001F | POSBAL | 0226 |
| PREQ | 0232 | PREV | 001D | PRINT | 0262 | PRTB | 0242 | PUPDT | 0014 | PUPDW | 0016 | QUIES | 00FB | RABINH | 0036 |
| RABINL | 0039 | RBLK | 01DA | RDFACT | 0021 | RDOWN | 018F | RECYC | 008A | RECYC1 | 00A9 | REMZ | 002F | RND | 00FE |
| ROW1 | 02D0 | ROW2 | 02DC | ROW3 | 02E8 | ROW4 | 02F4 | RSTAZ | 0177 | SETDIS | 01F8 | SETLIM | 0343 | SFEND | 03A4 |
| SIGN | 01E7 | SPABIN | 002B | SPANF | 002C | SPANT | 00E0 | SPARD | 00EB | SPNZRO | 032B | SQTRZ | 01F6 | START | 0022 |
| SUBT | 0358 | SYNC | 025A | TABM | 02CA | TIMER | 03B6 | TIMER1 | 03B8 | TIMER2 | 03BC | USLIM | 0337 | USPBAL | 0218 |
| WAIT6 | 0027 | ZADO | 00F3 | ZCOMP | 03E0 | ZEROB | 000B | ZLIM | 031B | ZLIMIT | 0300 | ZNEG | 0231 | ZSPANF | 0389 |

ASSEMBLY COMPLETE. NO ERRORS

ISIS-II ASSEMBLER SYMBOL CROSS REFERENCE V2.1

```
ABSR    316    325    329    332    347    378    447#   464    468    725    1014
ABYTE   418#   422
AGIN    213#   234
ANC     323    341#
AZTB    490    514#
BAD1    1213#  1218
BADD    319    473    1117   1180   1212#
BALCHK  744#   758    762    764    1109   1115
BCD     116    594#   603    635    661    847    1013   1016   1047   1072   1130   1270
BCDHI   194#   691    711    794
BCDLD   173#   179
BCDLO   171    193#   210
BIN1    633#   653
BIN2    638#   642
BIN3    646#   652
BIN4    296    301    346    397    446#   467    472    491    492    521    562    572    623
BINARY  593#   622    634
BINBCD  602#
BINTAB  211    1347#
BINZ    445#   465    471
BY2     618    620#
CAZTC   510#   522    1096
CHART   843#   849    935
COMP1   466    493    763    1111   1307#
CONVA   121#   129
CYCTR   281#   312    336    381
DBLK    692#   697
DCON    122#   182
DCONV   223#   231
DIG0    222    232#
DIG5    166    168#   169
DISB    665#   675
DISP    128    723    1134   1270#
DISP1   1279#  1289
DLY     817    819    893    923    1244#
DMOD    1131#  1133
DMOV    293    334    348    469    1015   1330#
DMOV1   1331#  1335
DVIDE   327    414#   423    563    1018
ERZTB   511#   514
ELR     882    885#
END5    166#   167
ENPRIN  788#   822
FABS    306    343#
FDLYS   310    345#
```

| | | | | | | | |
|---|---|---|---|---|---|---|---|
| FFILT | 280# | 308 | 343 | 747 | | | |
| FIRST | 825 | 842# | 848 | | | | |
| FIRZ | 464# | 719 | | | | | |
| FLG | 876 | 878# | | | | | |
| FORD | 127 | 377 | 1128# | | | | |
| FZ | 1274 | 1277# | | | | | |
| GOP | 731# | | | | | | |
| GORE | 332# | 349 | | | | | |
| INLIM | 1063 | 1089 | 1099# | | | | |
| INSERT | 819# | 820 | 821 | | | | |
| LIM5 | 1084 | 1086# | | | | | |
| LOV | 402 | 404# | | | | | |
| LSFT | 1186# | 1190 | | | | | |
| MDOT | 880 | 882# | 899 | | | | |
| MOTOR | 827 | 854 | 858 | 872 | 895 | 901 | 914# | 924 |
| MULT1 | 1168# | 1191 | | | | | |
| N | 592# | 631 | 633 | | | | |
| NADD | 1174 | 1182# | | | | | |
| NAZ | 547 | 553# | | | | | |
| NBAL | 749 | 768 | 771 | 773# | | | |
| NNORB | 815# | | | | | | |
| NODOT | 889 | 894# | | | | | |
| NOZERO | 1049 | 1061 | 1087 | 1096# | | | |
| NOZO | 532 | 536 | 540# | | | | |
| NPRT | 729 | 730 | 732# | 861 | | | |
| NROW | 870# | 906 | | | | | |
| NUM | 799 | 806# | | | | | |
| NWE | 1267# | 1284 | | | | | |
| NZUD | 458 | 461 | 463 | 467# | | | |
| OVERLD | 160 | 377# | | | | | |
| PAC | 849# | 856 | | | | | |
| PBAL | 460 | 728 | 746# | | | | |
| PBAL1 | 305 | 755 | 758# | | | | |
| PBMULT | 265 | 298 | 624 | 1157# | | | |
| PCALC | 339 | 458# | 549 | | | | |
| PCHAR | 852 | 868# | | | | | |
| PCLR | 118 | 208 | 380 | 604 | 727 | 1167 | 1231# | 1233 |
| PEBCON | 206# | | | | | | |
| PEND | 818 | 861# | | | | | |
| PND | 796# | 807 | | | | | |
| POL | 489# | | | | | | |
| PONZ | 134# | 135 | | | | | |
| POSBAL | 761 | 764# | | | | | |
| PREQ | 731 | 794# | | | | | |
| PREV | 282# | 333 | 1110 | | | | |
| PRINT | 824 | 846# | | | | | |
| PRTB | 802 | 804# | | | | | |
| PUPDT | 125 | 127# | | | | | |
| PUPDW | 123 | 128# | | | | | |
| QUIES | 248# | 859 | 1025 | 1287 | | | |
| RABINH | 196# | | | | | | |
| RABINL | 195# | 206 | 209 | 263 | 291 | 297 | |
| RBLK | 690# | | | | | | |
| RDFACT | 595# | 620 | 1073 | | | | |
| RDOWN | 571 | 581# | | | | | |
| RECYC | 291# | | | | | | |
| RECYC1 | 312# | | | | | | |
| REMZ | 161 | 163# | | | | | |
| RND | 397# | 531 | 535 | 554 | | | |
| ROW1 | 902 | 936# | | | | | |
| ROW2 | 902 | 949# | | | | | |
| ROW3 | 962# | | | | | | |
| ROW4 | 975# | | | | | | |
| RSTAZ | 525 | 528 | 542 | 544 | 552# | | |

```
SETDIS   713    723#
SETLIM   1080#  1083
SFEND    1181   1195#
SIGN     693    711#
SPABIN   251#   264    292    317
SPANF    250#   256    294
SPANT    259    352#
SPARD    249#   254    1271
SPNZRO   1053   1055#
SQTRZ    715    720#
START    121    155#   341    383    732
SUBT     302    330    1109#
SYNC     825#   828
TABM     914    929#
TIMER    164    173    1245#
TIMER1   1247#  1248
TIMER2   1247   1249#
USLIM    1027   1072#
USPBAL   753    755#
WAIT6    158#   165
ZADD     130    152#   155    612
ZCOMP    1310#  1316
ZEROB    1005#  1028
ZLIM     1036#  1037
ZLIMIT   462    1013#
ZNEG     1058   1060#
ZSPANF   1175#  1194

CROSS REFERENCE COMPLETE

ISIS-II MCS-48/UPI-41 MACRO ASSEMBLER, V3.0        PAGE    22
PRINTING ELECTRONIC BEAM
```

15/934  20/998  25/418

I claim:

1. A moving dot matrix printer for forming alpha and numeric characters on a recording medium comprising support means, elongated mounting means mounted upon said support means, a unitary print assembly means mounted upon said elongated mounting means for movement in a first path along said elongated mounting means between a start and a stop position, said unitary print assembly means being operative to mark an adjacent record medium, printer drive means operative during the formation of a character to selectively move said unitary print assembly means along said elongated mounting means between spaced points in said first path, said printer drive means including movable cam means mounted to contact said unitary print assembly means, said cam means operating to move said unitary print assembly means in said first path and bias means mounted to engage and bias said unitary print assembly means toward and into engagement with said movable cam means, record medium drive means mounted upon said support means and operative to position a record medium relative to said unitary print assembly means for marking thereby, said record medium drive means operating during the formation of a character to move said record medium in a second path transverse to the first path of movement of said unitary print assembly means.

2. The moving dot matrix printer of claim 1 wherein said printer drive means includes motor means mounted upon said support means, said elongated mounting means comprising a drive shaft mounted for rotation upon said support means, said motor means being connected to rotate said drive shaft, said cam means being secured to said drive shaft and rotatable therewith.

3. The moving dot matrix printer of claim 2 wherein said unitary print assembly means includes a carriage assembly mounted for movement along said drive shaft, electrically operated print means mounted upon said carriage assembly, said electrically operated print means including a dot printing means movable upon activation of said electrically operable print means in a direction substantially normal to the longitudinal axis of said drive shaft to engage a recording medium.

4. The moving dot matrix printer of claim 3 wherein said record medium drive means includes a record medium drive roller rotatably mounted upon said support means to extend adjacent to said carriage assembly and holddown means mounted upon said carriage assembly to hold a record medium against said record medium drive roller.

5. The moving dot matrix printer of claim 3 which includes control means connected to control the operation of said print means and said printer drive means to form characters on said record medium in accordance with data provided to said control means, said printer drive means operating to drive said record medium drive means.

6. The moving dot matrix printer of claim 5 wherein said record medium drive means includes a record medium drive roller rotatably mounted upon said support means and roller drive means connected between said drive shaft and said record medium drive roller and operative to cause said drive shaft to rotate said record medium drive roller only at spaced points in the rotational cycle of said cam means.

7. The moving dot matrix printer of claim 6 wherein said printer drive means operates to drive said unitary print assembly means in said first path from a start position to a stop position and then reverses the direction of drive and drives said unitary print assembly means in said first path from said stop to said start position.

8. The moving dot matrix printer of claim 7, wherein said control means operates to cause said electrically operable print means to print a dot on said record medium at selected spaced points as said print means moves between said start and stop positions.

9. The moving dot matrix printer of claim 8, wherein said record medium drive means operates to cause said record medium to move in said second plane each time said print means reaches said stop position from said start position and each time said print means reaches said start position from said stop position.

10. The moving dot matrix printer of claim 7, wherein said control means includes position sensing means to sense the position of said print means at the beginning of a printing operation, said position sensing means indicating when said print means is not in said start position and said control means operating upon receipt of such indication to cause said printer drive means to move said print means to the start position.

11. The moving dot matrix printer of claim 10, wherein said control means includes record medium sensing means to provide an indication when said record medium drive means is activated to receive a record medium.

12. The moving dot matrix printer of claim 11, wherein said control means operates to initiate printing by said print means only after said record medium sensing means indicates that said record medium drive means has been activated to receive a record medium and said position sensing means indicates that said print means is in the start position.

13. A moving dot matrix printer for forming alpha and numeric characters on a record medium comprising a support means, elongated mounting means secured to said support means, print means mounted upon said elongated mounting means for movement in a first path longitudinally along said elongated mounting means, said print means being also mounted for pivotal movement on said elongated mounting means and operative to mark an adjacent record medium, printer drive means mounted upon said support means and operative during the formation of a character to selectively move said print means along said elongated mounting means between spaced points in said first path, record medium drive means mounted upon said support means and operative to position a record medium relative to said print means for marking thereby, said record medium drive means operating during the formation of a character to move said record medium in a second path transverse to the first path of movement of said print means.

14. The moving dot matrix printer of claim 13 wherein said printer drive means includes cam means mounted to contact said print means and operating to move said print means longitudinally along said elongated mounting means.

15. The moving dot matrix printer of claim 14 wherein said printer drive means includes motor means mounted upon said support means, said elongated mounting means comprising a drive shaft mounted for rotation upon said support means, said motor means being connected to rotate said drive shaft and said cam means being secured to said drive shaft and rotatable therewith, and said record medium drive means includes a record medium drive roller rotatably mounted upon said support means in substantially parallel relationship to said drive shaft and adjacent said print means, and roller drive means connected between said drive shaft and said record medium drive roller and operative to cause said drive shaft to rotate said record medium drive roller only at spaced points in the rotational cycle of said drive shaft, and print means being pivotal about said drive shaft toward and away from said record medium drive roller.

16. The moving dot matrix printer of claim 15 wherein said cam means includes a disc cam having a cam face in contact with said print means, said record medium drive means including holddown means connected to said print means to pivot therewith about said drive shaft.

17. The moving dot matrix printer of claim 16, wherein said control means includes position sensing means to sense the position of said print means at the beginning of a printing operation, said position sensing means indicating when said print means is not in said start position and said control means operating upon receipt of such indication to cause said printer drive means to move said print means to the start position.

18. The moving dot matrix printer of claim 17, wherein said control means includes record medium sensing means to provide an indication when said record medium drive means is activated to receive a record medium.

19. The moving dot matrix printer of claim 18, wherein said control means operates to initiate printing by said print means only after said record medium sensing means indicates that said record medium drive means has been activated to receive a record medium and said position sensing means indicates that said print means is in the start position.

20. The moving dot matrix printer of claim 13, wherein said record medium drive means includes record medium hold down means connected to said print means to pivot therewith about said elongated mounting means.

21. The moving dot matrix printer of claim 20, wherein said record medium drive means includes a record medium drive roller rotatably mounted upon said support means beneath said record medium holddown means, said record medium holddown means being operable in a first position to clamp a record medium against said record medium drive roller and to pivot away from said first position with said print means to facilitate insertion of a record medium between said holddown means and said record medium drive roller.

22. The moving dot matrix printer of claim 21 which includes control means connected to control the operation of said print means and said printer drive means to form characters on said record medium in accordance with data provided to said control means.

23. The moving dot matrix printer of claim 22, wherein said elongated mounting means includes a drive shaft mounted for rotation upon said support means, and said printer drive means includes motor means operative to rotate said drive shaft, said print means being mounted on said drive shaft for movement longitudinally thereof.

24. The moving dot matrix printer of claim 23, wherein said record medium drive means includes roller drive means connected between said drive shaft and said record medium drive roller and operative to cause said drive shaft to rotate said record medium drive roller.

25. The moving dot matrix printer of claim 24, wherein said roller drive means operates to rotate said record medium drive roller only at spaced points in the rotational cycle of said drive shaft.

26. The moving dot matrix printer of claim 22, wherein said printer drive means operates to drive said print means in said first path from a start position to a stop position and then reverses the direction of drive and drives said print means in said first path from said stop to said start position.

27. The moving dot matrix printer of claim 26, wherein said control means operates to cause said print means to print a dot on said record medium at selected spaced points as said print means moves in said first path between said start and stop positions.

28. The moving dot matrix printer of claim 27, wherein said record medium drive means operates to cause said record medium to move in said second path at spaced points during the movement of said print means between said start and stop positions.

* * * * *